United States Patent [19]

Bekki et al.

[11] Patent Number: 4,964,056
[45] Date of Patent: Oct. 16, 1990

[54] AUTOMATIC DESIGN SYSTEM OF LOGIC CIRCUIT

[75] Inventors: Keisuke Bekki; Takayoshi Yokota; Tooru Nagai, all of Hitachi; Nobuhiro Hamada, Hitachiota, all of Japan

[73] Assignee: Hitachi, Ltd., Tokyo, Japan

[21] Appl. No.: 173,251

[22] Filed: Mar. 24, 1988

[30] Foreign Application Priority Data

Mar. 25, 1987 [JP] Japan ................................. 62-70702
Aug. 26, 1987 [JP] Japan ............................... 62-210187
Sep. 29, 1987 [JP] Japan ............................... 62-242454

[51] Int. Cl.$^5$ ........................................... G06F 15/60
[52] U.S. Cl. ..................................... 364/488; 307/465
[58] Field of Search ............... 307/465; 364/488, 489, 364/490, 491

[56] References Cited

U.S. PATENT DOCUMENTS

| T940,020 | 11/1975 | Brechling et al. | 364/491 X |
| 4,566,064 | 1/1986 | Whitaker | 364/489 X |
| 4,600,846 | 7/1986 | Burrows | 307/465 |
| 4,613,940 | 9/1986 | Shenton et al. | 364/491 X |
| 4,630,219 | 12/1986 | DiGiacomo et al. | 364/489 X |
| 4,701,860 | 10/1987 | Mader | 364/490 |
| 4,918,440 | 4/1990 | Furtek | 307/465 X |

FOREIGN PATENT DOCUMENTS 59-168545 3/1983 Japan .

OTHER PUBLICATIONS

Journal of Information Processing Society of Japan, vol. 19, No. 1, pp. 16–25 (1977).
Proceesings of 39th Knowledge Engineering System Conference, pp. 1–7 (1985).

Primary Examiner—Parshotam S. Lall
Assistant Examiner—Edward R. Cosimono
Attorney, Agent, or Firm—Kenyon & Kenyon

[57] ABSTRACT

An automatic design system of a logic circuit system includes a storage for storing information about structures and functions of known basic circuits available for a circuit system to be designed, an input device for receiving design specification information about the structures and functions of the circuit to be designed, and a synthesize section for combining the known basic circuits stored in the storage so as to synthesize the desired logic circuit satisfying the design specification information.

8 Claims, 36 Drawing Sheets

FIG. 2(a)

| 17 | 16 15 14 | 13 12 11 | 10 9 | 8 7 6 | 5 4 3 | 2 1 0 |
|---|---|---|---|---|---|---|
| 0 | FUNC | SFT | FLAG | B1 | B2 | B3 |
| 1 | FIFO | LTRL | LTC | | | |

FIG. 2(b) FUNC

| 16 15 14 | OPERATION |
|---|---|
| 0 0 0 | B3←B1 sgy B2 |
| 0 0 1 | B3←B1 sgx B2 |
| 0 1 1 | B3←B1 |
| 1 0 0 | B3←B1 + B2 |
| 1 0 1 | B3←B1 − B2 |
| 1 1 0 | B3←B1 and B2 |
| 1 1 1 | B3←B1 or B2 |

FIG. 2(f) OPERATOR sgx

| OPERATOR | CONDITION |
|---|---|
| + | flg = 1 |
| − | flg = 2 |
| B3←B1 | flg = 0 |

FIG. 2(g) OPERATOR sgy

| OPERATOR | CONDITION |
|---|---|
| + | flg = 2 |
| − | flg = 1 |
| B3←B1 | flg = 0 |

FIG. 2(c) BUS CONTROL

| 8 7 6 / 5 4 3 / 2 1 0 | B1 | B2 | B3 |
|---|---|---|---|
| 0 0 0 | NO_OP | NO_OP | NO_OP |
| 0 0 1 | B1←R1 | B2←R1 | R1←B3 |
| 0 1 0 | B1←R2 | B2←R2 | R2←B3 |
| 0 1 1 | B1←R3 | B2←R3 | R3←B3 |
| 1 0 0 | B1←R4 | B2←R4 | R4←B3 |
| 1 0 1 | B1←R5 | B2←R5 | R5←B3 |
| 1 1 0 | | | |
| 1 1 1 | | | |

FIG. 2(h) FIFO

| 15 16 | OPERATION |
|---|---|
| 0 0 | NO OP |
| 0 1 | WRITE |
| 1 0 | READ |
| 1 1 | |

FIG. 2(d) SFT

| 13 12 11 | OPERATION |
|---|---|
| C | $2^C$ |

FIG. 2(i) FLAG

| 10 9 | OPERATION |
|---|---|
| 0 0 | Z=0 flg(0)←1 |
| 0 1 | Z≠0 flg(1)←1 |
| 1 0 | flg(0)←0, flg(1)←0 |
| 1 1 | NO OP |

FIG. 2(e) LTC

| 10 9 | OPERATION |
|---|---|
| 0 0 | NO OP |
| 0 1 | B1(0,3)←LTRL |
| 1 0 | B1(4,7)←LTRL |
| 1 1 | |

FIG. 4

| FUNCTION CIRCUIT MODULE NAME | INFORMATION NAME | VALUE |
|---|---|---|
| B1 | INPUT TERMINAL | [ in1, in2, in3, in4, in5 ] |
| B1 | OUTPUT TERMINAL | [ out ] |
| B1 | CONTROL TERMINAL | [ C(4), C(3), C(2), C(1), C(0) ] |
| B1 | OPERATION | [ no-op [0, 0, 0, 0, 0 ]] |
| B1 | OPERATION | [-in1, [0, 0, 0, 0, 1 ]] |
| B1 | OPERATION | [-in2, [0, 0, 0, 1, 0 ]] |
| B1 | OPERATION | [-in3, [0, 0, 1, 0, 0 ]] |
| B1 | OPERATION | [ in4, [0, 1, 0, 0, 0 ]] |
| B1 | OPERATION | [ in5, [ 1, 0, 0, 0, 0 ]] |

FIG. 5

| MICRO INSTRUCTION FIELD | FIELD BIT PATTERN | OPERATION OF FUNCTION CIRCUIT MODULE |
|---|---|---|
| BUS CONTROL FIELD | | |
| BI | [0,0,0] | [BI, no-op] |
| BI | [0,0,1] | [BI, in1] |
| BI | [0,1,0] | [BI, in2] |
| BI | [0,1,1] | [BI, in3] |
| BI | [1,0,0] | [BI, in4] |
| BI | [1,0,1] | [BI, in5] |

FIG. 6

| INPUT | OUTPUT |
|---|---|
| $x_1$ $x_2$ $x_1$ | $y_5$ $y_4$ $y_3$ $y_2$ $y_1$ |
| [0, 0, 0] | [0, 0, 0, 0, 0] |
| [0, 0, 1] | [0, 0, 0, 0, 1] |
| [0, 1, 0] | [0, 0, 0, 1, 0] |
| [0, 1, 1] | [0, 0, 1, 0, 0] |
| [1, 0, 0] | [0, 1, 0, 0, 0] |
| [1, 0, 1] | [1, 0, 0, 0, 0] |

FIG. 13
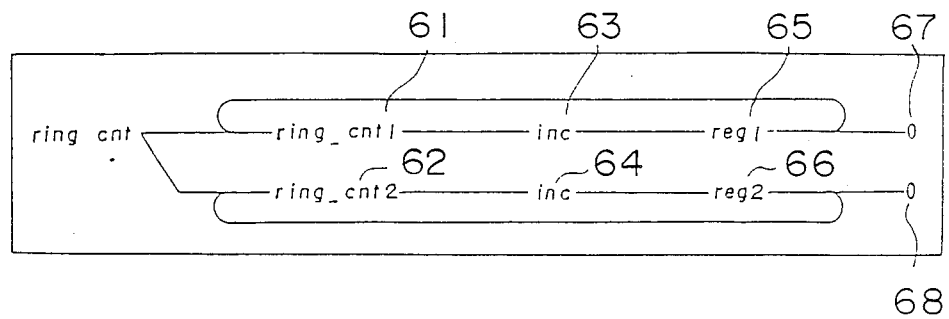
FIG. 14
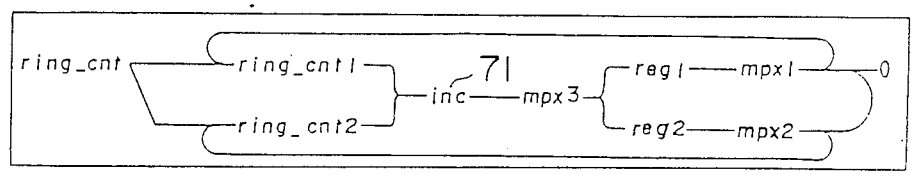
FIG. 15
```
[net_work, ring_cnt, in, inc]
[net_work, inc, in, mpx3]  ——81
[net_work, mpx3, in1, reg1, in2, reg2]
[net_work, reg1, in, mpx1]
[net_work, reg2, in, mpx2]
[net_work, mpx1, in1, ring_cnt1, in2, 0]
[net_work, mpx2, in1, ring_cnt2, in2, 0]
[net_work, ring_cnt1, in, ring_cnt] ——82
[net_work, ring_cnt2, in, ring_cnt] ——83
```

```
fifo(F)
    decode F
        0:= fifo=ram(ring_cnt1,,0),
            cmp(ring_cnt1, ring_cnt2),next
            ring_cnt1(0,1)                       ~91
        1:= fifo=ram(ring_cnt2,data_in,1),
            cmp(ring_cnt1, ring_cnt2),next        ~92
            ring_cnt2(1,1)
```

[net_work, ram in1, address_in, in2, data_in]
[net_work, address_in, in, mpx3]
[net_work, cmp in1, mpx3, in2, ring_out]

FIG. 24

```
define([stk,[0,11]],
        [[module,stc-01],[cntr,cntrx],[ram,ramx],
        [clock,phai1],[depth,[0,7]],[timing,1]]).
                                                        241 define(stk-behavior,:=,
        decode,[r1,[0,1]],=>,
            0,:=,noop,
            1,:=,[[ramx(cntrx),=,r2],next,
                    [cntrx,=,[cntrx,+,1]]],           242
            2,:=,[[r3,=,ramx(cntrx)],next,
                    [cntrx,=,[cntrx,-,1]]],
            3,:=,[[cntrx,=,0]]]).
```

FIG. 25 facet(value, relationship, stc-01,

[[module, M], [clock, P], [depth, [S1, S2]],
[bit-length, [N1, N2]], [cntr, C], [ram, R],
[timing, N],
[elements, [[[C, log2([S1, S2])],
[[module, cnc-01], [clock, next(P)], [timing, addl(N)]]],
[[R, [S1, S2]],
[[module, rac-01], [clock, P], [timing, N], [address, [S1, S2]]]]]). }PARAMETER ARGUMENTS

ELEMENTS

FIG. 26 facet(value, module-model, cnc-01,

[[module,M],[clock,P],[timing,N]

[bit-length,[N1,N2]]  ~261

262 {
    [behavior,[decode, control-in(O,I), ⇒

[0,:=,noop,

1,:=,[[M,=,[M,+,I]]],

2,:=,[[M,=,[M,-,I]]],

3,:=,[[M,=, O]]]]]]).

facet(value, module-model, rac-01,

[[module,M],[clock,P],[timing,N], ~263

[bit-length,[N1,N2]],[address,[M1,M2],

[arguments,[A]],

[assign,[[A,address-in]]]

264 {
    [behavior,[decode,control-in(O),⇒,

[0,:=,noop,

| cntrx | | |
|---|---|---|
| clock | phai2 | |
| timing | 2 | ~301 |
| bit-length | [0,2] | |
| behavior | [decode, control-in(0,1), ⇒, | |
| | [0, := , noop, | |
| | 1, := , [[cntrx, =, [cntrx, 1]]], | |
| | 2, := , [[cntrx, =, [cntrx, 1]]], | |
| | 3, := , [[cntrx, =, 0]]]] | |

| ram(address-in) | | |
|---|---|---|
| clock | phai1 | |
| address | [0,7] | ~302 |
| bit-length | [0,11] | |
| timing | 1 | |
| arguments | [address-in, address-in] | |
| assign | [address-in, address-in] | |
| behavior | [decode, control-in(0), ⇒ | |
| | [0, := , noop, | |
| | 1, := , [[ramx(address-in), =, in]]]] | | link([stk,in1],[r2,out]).
link([stk,control-in1],[r1,[0,1]]).
link([stk,out1],[r3,in]).

link([stk,out],[ramx,out]).

link([stk,in],[ramx,in]).

link([cntrx,out],[ramx,address-in]).

FIG. 39

```
control([ ], noop).
control([[1,[[ramx,control-in],=,1]]
        [2,[[cntrx,control-in],=,1]]],
            [[ramx(cntrx),=,in],next,
                [cntrx,=,[cntrx,+,1]]]).
control([[2,[[cntrx,control-in],=,2]]],
            [[out,=,ramx(cntrx)],next,
                [cntrx,=,[cntrx,-,1]]]).
control([[2,[[cntrx,control-in],=,3]]],
            [[cntrx,=,0]]).
```

FIG. 41 control1([[1,[stc,control-in],=,0]],[noop]).

control1([[1,[stc,control-in],=,1]],
 [[ramx(cntrx),=,in],next,
 [cntrx,=,[cntrx,+,1]]]).

control1([[1,[stc,control-in],=,2]],
 [[out,=,ramx(cntrx)],next,
 [cntrx,=,[cntrx,-,1]]]).

control1([[1,[stc,control-in],=,3]],[[cntrx,=,0]]).

FIG. 42

```
control 1([[l,[stc,control-in],=,0]],
         [[l,[[ramx,control-in],=,0]],
         [2,[[cntrx,control-in],=,0]]]).
control 1([[l,[stc,control-in],=,1]],
         [[l,[[ramx,control-in],=,1]],
         [2,[[cntrx,control-in],=,1]]]).
control 1([[l,[stc,control-in],=,2]],
         [[l,[[ramx,control-in],=,0]],
         [2,[[cntrx,control-in],=,2]],
control 1([[l,[stc,control-in],=,3]],
         [[l,[[ramx,control-in],=,0]],
         [2,[[cntrx,control-in],=,3]]]).
```

| INPUT TERMINAL | | OUTPUT | | |
|---|---|---|---|---|
| [stc, control-in] | | [ramx, control-in] | [cntrx, control-in] | |
| bit 1 | 0 | 0 | 1 | 0 |
| [0,1] | [0,1] | [0,1] | [0,2] | [0,2] |
| [0,1] | [1,1] | [1,1] | [0,2] | [1,2] |
| [1,1] | [0,1] | [0,1] | [1,2] | [0,2] |
| [1,1] | [1,1] | [0,1] | [1,2] | [1,2] |

NOTE: [TRUTH VALUE, TIMING]

AUTOMATIC DESIGN SYSTEM OF LOGIC CIRCUIT

FIELD OF THE INVENTION

The present invention relates to an automatic design system of a logic circuit, and in particular, to a system for designing a desired circuit based on information about functions and configuration of the circuit to be designed.

BACKGROUND OF THE INVENTION

A method of designing a logic circuit has been described, for example, in the Journal of Information Processing Society of Japan, Vol. 19, No. 1, pp. 16–25 (1977). In the method, however, an automatic generation of a bit pattern of a microcode is not effected, namely, a logic circuit to execute a microprogram is not automatically designed; furthermore, when generating a bit pattern, it is necessary to beforehand input a considerably great number of information items. Consequently, a long period of time is required to design the logic circuit by human power.

Moreover, in the Digests of the Design Automation Study, Vol. 21, No. 1 (1984) or the Proceedings of 39th Knowledge Engineering System Conference, pp. 1–7 (1985), there is described an automatic design method in which information necessary to automatically generate all function circuit modules constituting a logic circuit to be designed must be manually inputted by use of a hardware description language.

Furthermore, in the JP-A-No. 59-168545 filed on Mar. 15, 1983 by Fujitsu Ltd., there is described an automatic logic circuit design system in which information about known logic circuit modules, each having a function is beforehand stored as wiring information between logic gates in a develop or expand data storage of a computer such that the information of the develop data storage is read therefrom when required during an automatic design of a logic circuit. In this system, although automatic design is possible for simple function modules such as a register, a counter, and an incrementor, circuit modules having sophisticated functions such as a control circuit module controlling an execution of a microprogram cannot be automatically designed because such a control circuit module with a comprehensive function includes an irregular logic circuit, which cannot be automatically designed by use of the information read from the develop data storage.

SUMMARY OF THE INVENTION

It is therefore an object of the present invention to provide a system for automatically designing a logic circuit having an advanced function based on information of a simple specification description to be easily understood by those who are concerned with the logic circuit.

According to the common configuration of the present invention, in order to achieve the object above, function information and structure information about known logic circuits are stored beforehand in a storage, circuit function information and circuit structure information about a logic circuit to be designed are supplied as design specification information, and the supplied information items are combined with the information items of the known circuits stored in the storage so as to automatically design the desired logic circuit satisfying the design specification.

According to an embodiment of the present invention, there is provided an automatic design system of a control signal generation logic circuit supplying control signals to circuits to be controlled by microprograms. In the automatic design system, based on control instructions each having a bit pattern and information about the configuration of each function circuit module of a circuit to be controlled by a microprogram, the operations to be effected by the respective function modules are analyzed. Depending on the results of the analysis, the operation of each function module is transformed or converted into first operation information associated with the bit patterns. With reference to the first operation information and second operation information associated with bit patterns of control signals of the circuit, bit patterns matching with the operation content are extracted from the respective operation information so as to generate from the extracted bit patterns truth value information of the control signal generation logic circuit to be designed. The control signal generation logic circuit is then generated by use of the truth information thus obtained.

In addition, according to another embodiment of the present invention, an automatic design system of a circuit module is provided having a desired function in which a specification of operations related to the structure and functions of known circuit modules are registered to a storage. Based on the specification of operations thus registered, an analysis is conducted on the operation specification of the circuit module to be designed so as to extract groups of operation specifications of known circuit modules satisfying the operation specifications of the objective circuit module, thereby determining the operation specifications in detail of the new circuit module. During the operation to determine the detailed specifications of operations, network information among the groups of operation specifications of known modules is extracted. By use of the detailed operation specification and network information, the circuit module having the desired circuit function is automatically designed.

According to yet another embodiment of the present invention, there is provided an automatic design system of function modules of a logic circuit such as a register module, a counter module, and a control module. In this design system, information about basic elements constituting function modules and information about operations of the function modules are stored in a storage in advance. A retrieval is achieved in the storage to extract information of function modules matching with the specifications required for the function module to be designed, the elements constituting the function module and the operation specifications thereof are defined in detail, connection information among the elements is extracted from the detailed definitions, and truth value information of the function module is determined by use of relationships between the control signals which are inputs to the function module and the control signals of the elements, thereby generating a logic circuit satisfying the truth value information.

BRIEF DESCRIPTION OF THE DRAWINGS

The present invention will be apparent from the following detailed description taken in conjunction with the accompanying drawings in which:

FIG. 2(a)-(i) is an explanatory diagram useful to explain the configuration of the control instruction format;

FIG. 4 is a schematic diagram for explaining information items about the constitution and operations of a bus B1;

FIG. 5 is a diagram schematically showing relationships between a bit pattern and operation information of the bus B1;

FIG. 6 is an explanatory diagram useful to explain the configuration of truth value information;

FIG. 13 is a diagram schematically showing positional relationships with respect to adjacency among known circuit modules extracted from the operation specifications of a ring counter;

FIG. 14 is a diagram schematically showing positional relationships with respect to adjacency among known circuit modules attained through an optimization effected on the positional relationships of FIG. 13;

FIG. 15 is a schematic diagram showing network information of a ring counter;

FIG. 24 is a diagram showing an input information example of operation descriptions of a circuit;

FIG. 25 is a diagram showing an information example of relational description of design parameters;

FIG. 26 is a diagram showing a description example of a circuit library;

FIG. 30 is a diagram showing an example of operation description information of a generated parts circuit;

FIG. 39 is a diagram showing an example of generated control signals;

FIG. 41 is a schematic diagram showing an example of description about relationships between external signals and control signals;

FIG. 42 is an explanatory diagram useful to explain generated input/output signals (control circuit);

DETAILED DESCRIPTION

Figure 1:
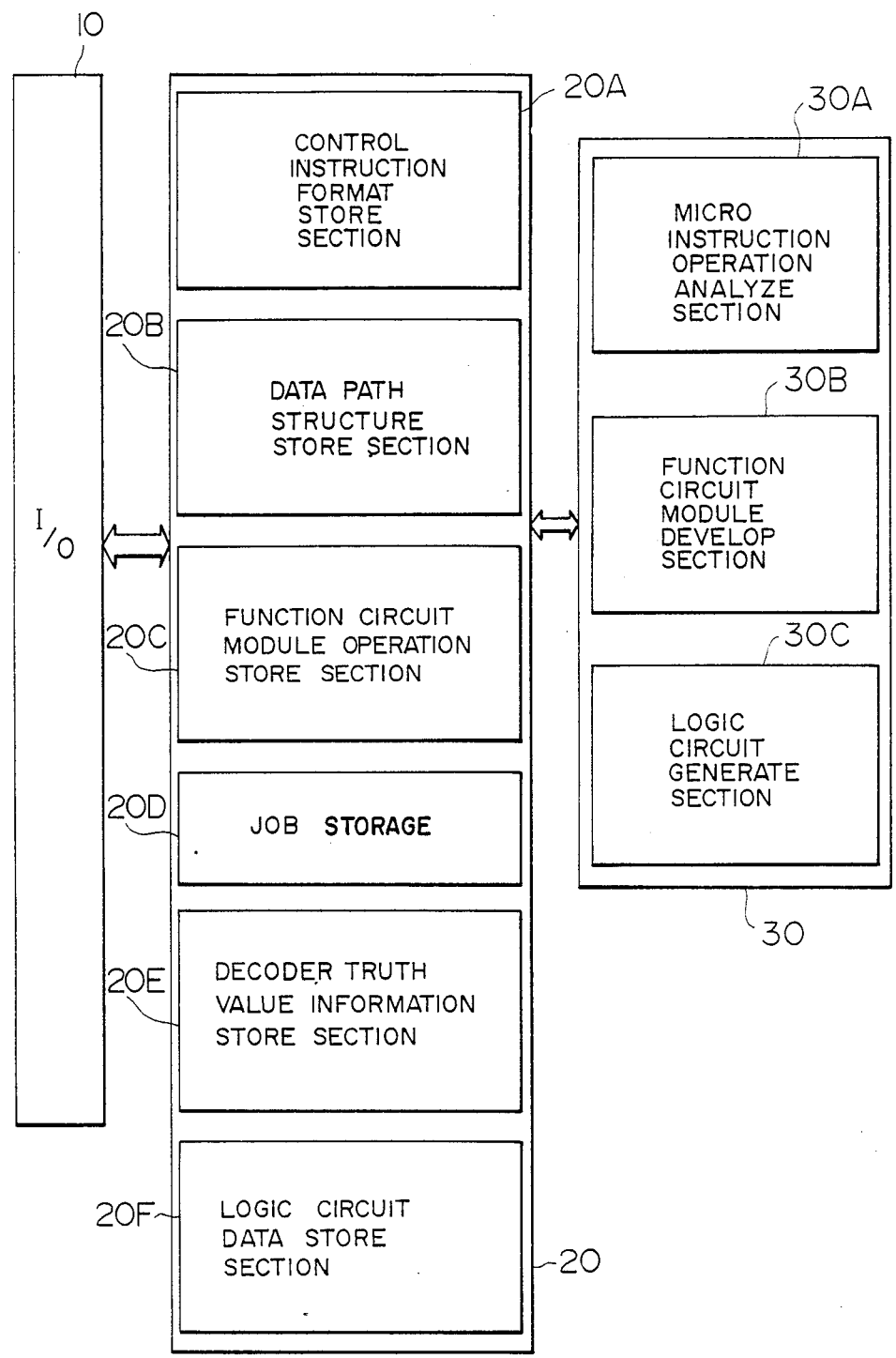
FIG. 1 is a schematic diagram showing a configuration of a first embodiment of an automatic design system of a logic circuit to which the present invention is applied.
Figure 3:
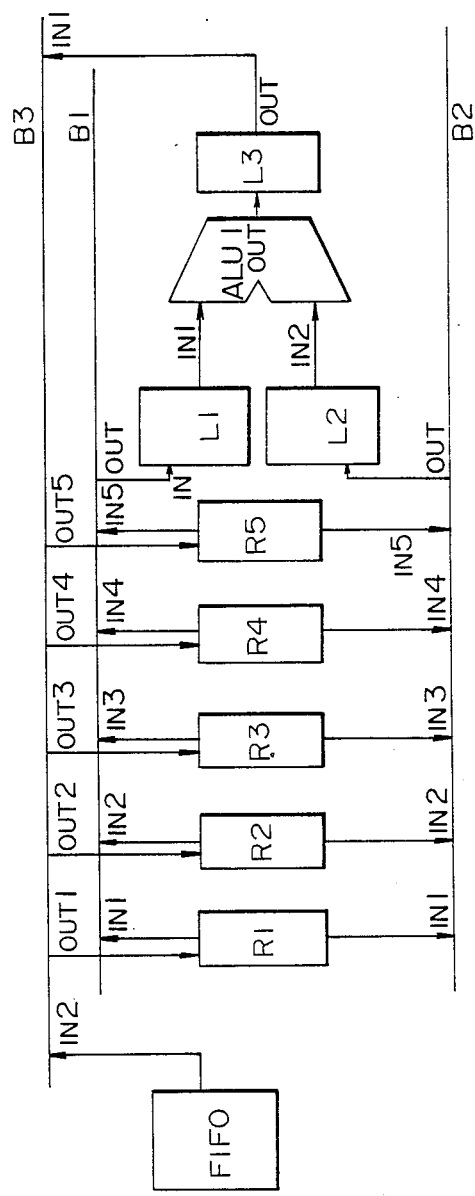
FIG. 3 is an explanatory diagram useful to explain a data path configuration of a circuit controlled by a microprogram.

FIG. 1 shows a block diagram of a first embodiment of an automatic logic circuit design system according to the present invention. The system of FIG. 1 is a logic circuit generation apparatus for automatically designing a decoder generating signals controlling data paths of a circuit controlled by a microprogram. FIG. 3 shows an example of a circuit controlled by a microprogram. This embodiment will be described with reference to an example of a case where a logic circuit of a decoder circuit to generate signals controlling a circuit of FIG. 3 is automatically designed. In the example of FIG. 3, the circuit system includes five registers R1, R2, R3, R4, and R5; three latches L1, L2, and L3 for temporarily storing data, an arithmetic logic unit ALU 1 for executing arithmetic operations such as addition, subtraction, OR, and AND, and a first-in first-out (FIFO) unit. These constituent elements are connected to each other with three internal buses B1, B2, and B3.

In FIG. 1, the logic circuit generation apparatus includes an input/output section 10, a store section 20, and a processing section 30. The input/output section 10 is connected to a keyboard and a cathoderay tube (CRT) not shown such that various information items are stored via the input/output section 10 into the store section. The store section 20 comprises a control instruction format store section 20A, a data path structure store section 20B, a function circuit module operation storage section 20C, a job store section 20D, a decoder truth value information store section 20E, and a logic circuit data store section 20F.

The control instruction format store section 20A is disposed to store a control instruction format constituted with 18 bits, which includes bits 0–2 indicating a field of a bus B3, its 3–5 denoting a field of a bus B2, and bits 6–8 designating a field of a bus B1. Furthermore, bits 9 and 10 respectively indicate a flag field, FLAG and a literal control field, LTC; bits 11 to 13 denote a shift field, SFT; bits 14 to 16 designate a function field, FUNC; and bits 11 to 14 indicate an LTRL field, bits 15 and 16 denote an FIFO field. The fields in a range from bit 9 to bit 16 are respectively selected depending on whether the value of bit 17 is 0 or 1. The contents of these fields are shown in (b) to (i) of FIG. 2. The contents of each of the fields function as follows. For example, as for the bus B1 shown in (c) of FIG. 2, when the bits 6 to 8 are 0,0,0, the contents indicate a no-operation, whereas if the bits 6 to 8 are 0,0,1, the contents denote an operation of the circuit of FIG. 3, namely, the content of register R1 is transferred to the bus B1. If the bits 6 to 8 are 0,1,0, the contents designate that the content of register 2 is transferred to the bus B1. More particularly, FIG. 2 shows an example of format information of a micro instruction stored in the control instruction format store section.

FIG. 2(a) shows a field layout of the micro instruction. When bit 17 of the micro instruction is 0, the system executes an instruction FUNC, SFT, FLAG, B1, B2, B3; whereas if bit 17 is 1; an instruction FIFO, LTRL, LTC, B1, B2, B3 is executed.

FIG. 2(b) shows a definition of an instruction FUNC. In accordance with this definition, the instruction is executed depending on the contents of bits 16, 15, and 14 as follows.

000: B3 < −B1 sgy B2
001: B3 < −B1 sgx B2
011: B3 < −B1
100: B3 < −B1+B2
101: B3 < −B1−B2
110: B3 < −B1 and B2
111: B3 < −B1 or B2

FIG. 2(c) shows a definition of an instruction for controlling buses B1, B2, and B3. In this definition, the values of bits 8, 7, and 6.

000: No operation.
001: B1 < −R2
010: B1 < −R3
100: B1 < −R4
101: B1 < −R5

In addition, the micro instruction is executed depending on the contents of bits 5, 4, and 3 follows.

000: N operation.
001: B2 < −R1
010: B2 < −R2
011: B2 < −R3
100: B2 < −R4
101: B2 < −R5

Furthermore, the instruction is executed as follows depending on the values of bits 2, 1, and 0.

000: No operation.
001: R1 < −B3
010: R2 < −B3
011: R3 < −B3
100: R4 < −B3
101: R5 < −B3

Moreover, FIG. 2(d) shows an instruction for controlling a shift operation. For example, when bits 13, 12, and 11 of the micro instruction are 001, c=1; in consequence, there is achieved a 1-bit shift to the left by use of a shift register. Similarly, when bits 13, 12, and 11 of the micro instruction are 010, C=2; in consequence, there is achieved a 2-bit shift to the left by use of a shift register.

FIG. 2(e) shows a definition of a micro instruction to control a literal transfer. When bits 10 and 9 of the micro instruction are 00, the system does not achieve any operation. If the values are 01, a value of an LTRL field (bits 13, 12, and 11) of the micro instruction is transferred to B1(0,3) (namely, bits 0 to 3 of bus B1). When the values are 10, the value of the LTRL field is transferred to B1(4,7). FIG. 2(f) defines an operator sgx employed in FIG. 2(b). When the value of the register flg. is 1, 2, and 0, respectively, this operator achieves operations of an addition (+), a subtraction (−), and B3 < −B1, respectively.

FIG. 2(g) shows a definition of a conditional operator sgy, which conducts an addition (+), a subtraction (−), and B3 < −B1 when the value of the register flg is 2, 1, and 0, respectively. FIG. 2(h) shows a definition of a micro instruction for controlling an FIFO write and read operations. When bits 15 and 16 are 00, the system does not conduct any operation. For values of 01, data is read from the FIFO, FIG. 2(i) is a definition of an instruction controlling operations thereof depending on the content of the FLAG field. When bits 10 and 9 of the micro instruction are 00, the value of bit 0 of the register flg is set to 1 if the register z contains 0. When bits 10 and 9 of the micro instruction are 01, the value of bit 1 of the register flg is set to 1 if the register z contains other than 0. When the values are 10, an operation flg(01,) < −0 is conducted, whereas for the values 11, the system does not execute any operation.

The store section 20B associated with the data path configuration is disposed to store information about the configurations of the respective function modules such as the buses, registers, and ALU of the circuit of FIG. 3. For example, information concerning the configuration of a function circuit module of the bus B1 includes as shown in FIG. 4 information items such as in1 to in5 as input terminals, out as an output terminal, and c(4), c(3), c(2), c(1), and c(0) as control terminals. FIG. 4 shows a definition of functions of the bus B1. The field of function circuit module name indicates a name of a module to be defined. In this example, B1 is specified to define a function associated with the bus B1. The field of information name denotes a characteristic of information to be specified. This field may contain four kinds of entries. namely, input terminal, output terminal, operation, and control terminal items. The input terminal item is specified to define an input terminal of the module. This definition indicates that the bus B1 has five input terminals in1, in2, in3, in4, and in5; an output terminal out, and a 5-bit control terminal c(0,4). In the definition of operations, relationships between the input, output and control terminals are specified. For example, when the values of C(4), C(3), C(2), C(1), and C(0) are respectively 00000, the system does not execute any operation. According to this definition, for the values 00001, the content of in1 is delivered to out; for the values 00010, the content of in2 is fed to out; and for the values 00100, the content of in3 is outputted to out.

When the contents of the control instruction format store section 20A and the data path configuration store section 20B are transferred to the processing section 30, the micro instruction analyze section 30A analyzes operations of the respective function circuit modules so as to transform the operations of the function circuit modules into first operation information associated with bit patterns. For example, as first operation information related to the bus B1 as a function circuit module, there are generated information items [B1, NO-OP] to [B1, in5] as operations of the bus B1 corresponding to the bit patterns [0, 0, 0] to [1, 0, 1] as shown in FIG. 5. The first item, namely, micro instruction field indicates a field indicates a field of a micro instruction. The entries of this example include information items of the B1 field associated with the control of the bus B1. The second item, namely, field bit pattern is a definition of the B1 field defined in FIG. 2, namely, this field corresponds to the definition of the bits 8, 7, and 6 of the micro information. The third item, namely operation of function circuit module describes an operation of B1 associated with the pertinent micro instruction. This field corresponds to the information of the third item of FIG. 4. The contents of the bit patterns are as follows. Namely, the bit pattern [0, 0, 0] of the control instruction denotes that the no-operation is assigned to the bus B1, whereas the bit pattern [0, 0, 1] of the control instruction indicates that the control terminal C[0] of the bus B1 is closed so as to transfer the content of the register R1 to the input terminal in1. These items of first operation information are stored in the job store section 20D.

The function circuit module operation store section 20C is disposed to store information specifying functions of the respective function circuit modules, namely, second operation information associated with the bit patterns of the control signals processed in the circuit of FIG. 3. The second operation information thus stored includes, for example, the content [0, 0, 0, 0, 0] as a bit pattern of a control signal of no-operation NO-OP when the function circuit module is assumed to be the bus B1 and information items [0, 0, 0, 0, 1] to [1, 0, 0, 0, 0] shown in FIG. 4 as bit patterns of control signals which closes the control terminals of the input terminals in1 to in5 so as to transfer the content of the register to the bus B1.

Figure 7:
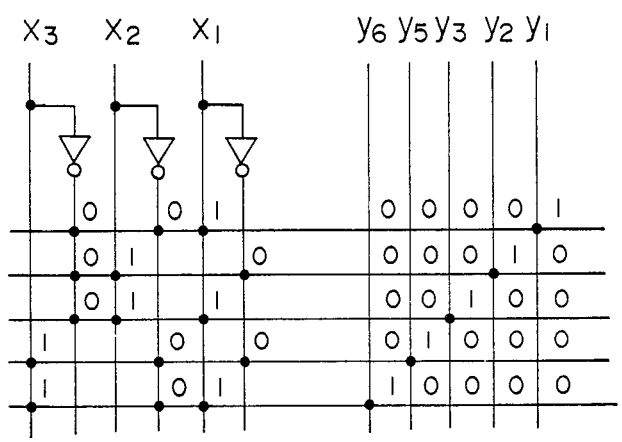
FIG. 7 is a diagram showing the layout of a bit pattern of a programmable logic array, PLA.

When the contents of the function circuit module operation store section 20C and the job store section 20D are transferred to the processing section 30, the truth value information generate section shown as Function Circuit Module Develop Section 30B extracts from various operation information items, with reference to the first operation information and the second operation information, bit patterns for which the operation contents matches, thereby generating truth value information according to the extracted bit patterns. For example, there is generated for the bus B1 as shown in FIG. 6 truth value information including bit pattern from the bit patterns of FIGS. 4 and 5 for which the operation contents match with each other. FIG. 6 shows input/output relationships of a decoder necessary for executing the operation of the B1 field defined in FIG. 2. The first item specifies an input bit pattern. The output field defines an output bit pattern associated with the input bit pattern. Namely, the bit pattern [0, 0, 1] of the control instruction is set to correspond to the bit pattern [0, 0, 0, 0, 1] of the control signal. The truth value information thus attained is stored in the decoder truth value information store section 20E. When generating a decoder as a logic circuit to generate control signals controlling the circuit of FIG. 3, the contents of the decoder truth value information store section 20E are transferred to the logic circuit generate section 30C, which in turn, for example, by means of a PLA, generates bit patterns of the PLA as shown in FIG. 7 and stores the contents thereof in the logic circuit data store section 20F. FIG. 7 shows a circuit diagram in which the truth value representation of FIG. 6 is implemented by a programmable logic array (PLA). Inputs X1, X2, and X3 are supplied together with negation or NOT results associated therewith. Horizontal lines indicate outputs attained through AND logic operations. For example, the upper-most line denotes a logic of $\overline{X3}A\overline{X2}AX1$. Outputs y1 to y6 are obtained as results of OR logic operations conducted on the outputs from the respective AND logic operations. Control signals to control the circuit systems to be controlled (FIG. 3) can be generated from the bit pattern contents stored in the logic circuit store section 20F.

Figure 8:
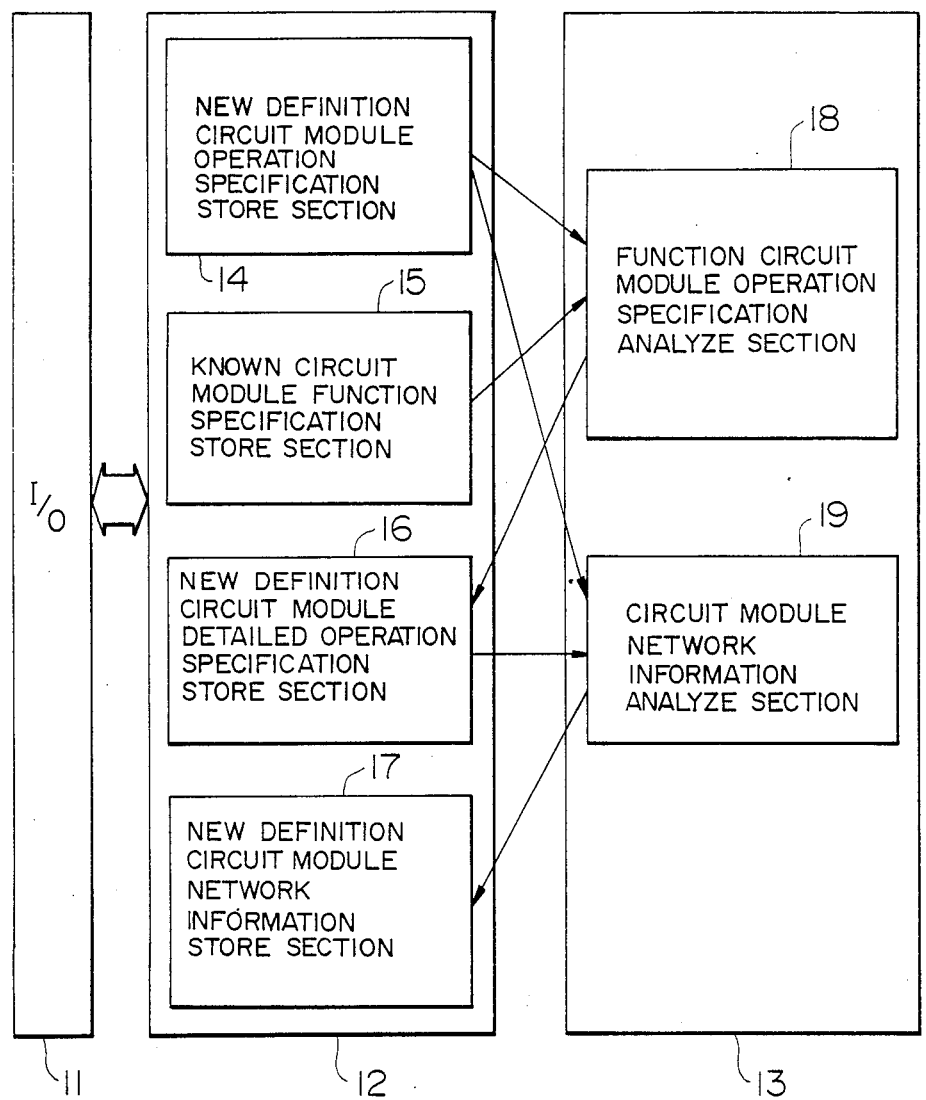
FIG. 8 is a block diagram schematically illustrating the overall constitution of a second embodiment of an automatic design system of a logic circuit according to the present invention.

FIG. 8 shows a block diagram of a second embodiment of an automatic logic circuit design system according to the present invention. The configuration of this embodiment corresponds to that of FIG. 1. In this embodiment, there is shown an automatic design system of a logic circuit module having a desired circuit function. Referring now to an example of an FIFO circuit as a circuit module to be designed, a description will be given of the embodiment.

The apparatus implementing the method of the present invention includes, as shown in FIG. 1, an input-/output section 11, a store section 12, a processing section 13. The store section 12 includes a new definition circuit module operation specification store section 14, a known circuit module function specification store section 15, a new definition circuit module detailed operation specification store section 16, and a new definition circuit module network information store section 17. The processing section 13 comprises a circuit module operation specification analyze section 18 and a circuit module network information analyze section 19.

In this configuration, the logic circuit designer inputs operation specifications of a logic circuit module to be designed through the input/output section 11 having a keyboard, a CRT, or the like (not shown). The operation specifications are stored in the new definition circuit module operation specification store section 14 of the store section 12. Furthermore, function specifications of primitive known circuit modules such as a register, a bus, and an arithmetic logic unit (ALU) are beforehand stored in the known circuit module function specification store section 15.

Figure 9:
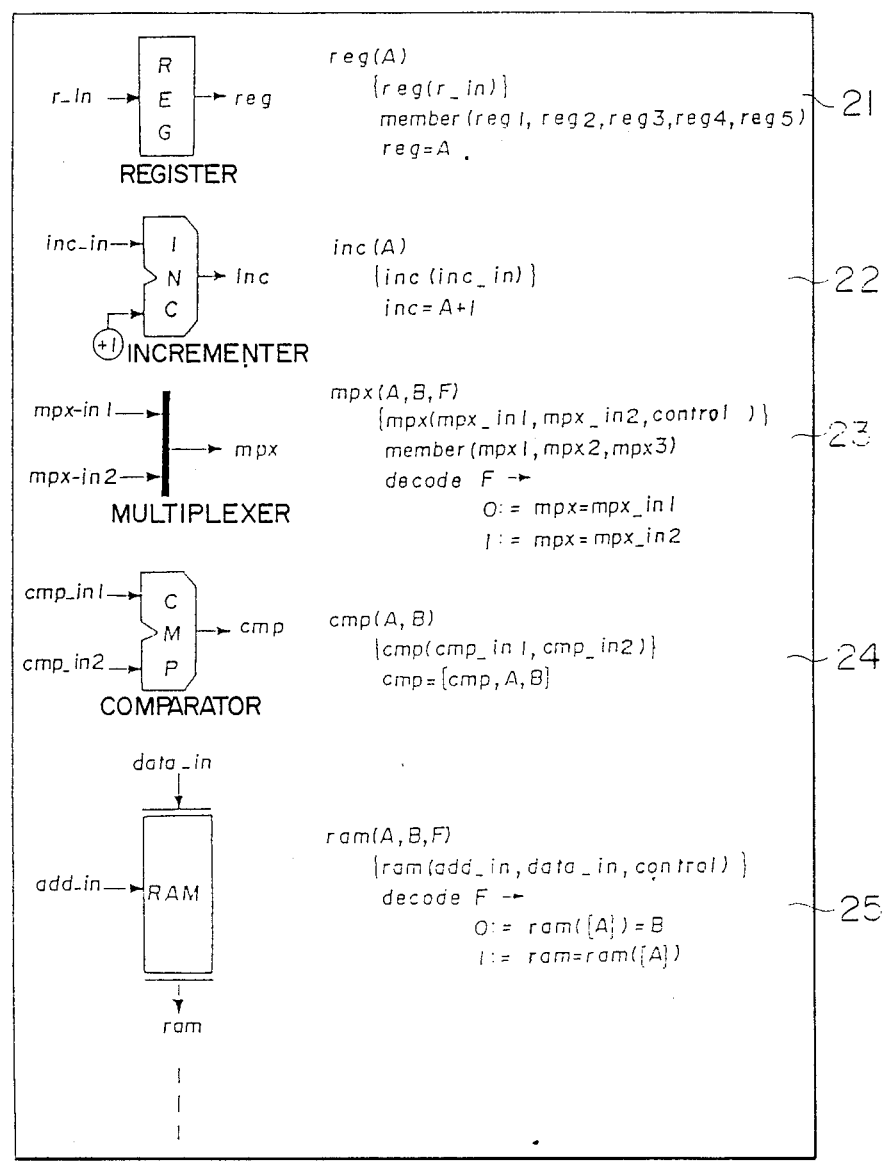
FIG. 9 is a schematic diagram showing a specific example of functions associated with a primitive known circuit module.

FIG. 9 shows an example of function definitions of the primitive known circuit modules beforehand stored in the known circuit module function specification store section 15. In this example, operation definitions are defined for such known function circuit modules as a register 21, an incrementor 22, a multiplexer 23, a comparator 24, and a random access memory (RAM) 25. For example, for the structure specifications of the register 21, there is defined reg (A), where reg denotes an output terminal name and (A) indicates an input signal. Next, {reg(r−in)} is defined as an input terminal name specification, where r−in denotes an input terminal name. In a case where a plurality of registers are to be similarly defined, a set of such registers reg1 to reg5 are defined as member (reg1, reg2, reg3, reg4, reg5). Finally, data "A" to be inputted to this register is specified as reg=A, thereby completing the definition of the register 21. Similarly, for the multiplexer 23, the structure specifications are specified with mpx (A, B, F), where mpx and (A, B, F) designate an output terminal name and input signals, respectively. Furthermore, {mpx(mpx−in1, mpx−in2, control)} is defined as the input terminal name specification, which indicates that the multiplexer 23 includes input terminals respectively having input terminal names mpx−in1 and mpx−in2 and a control terminal assigned with control as a terminal name. The definition member (mpx1, mpx2, mpx3) designates that there are dipsosed three multiplexers mpx1 to mpx3 each having the same function. Next, F→and the subsequent description indicate an operation to select one of two input signals depending on the condition judgment on the signal value of the control signal F. That is, for F=0 in this example, the signal from the input terminal name mpx−in1 is supplied to the output terminal mpx; whereas for F=1, the signal from the input terminal name mpx−in2 is fed to the output terminal mpx.

The known circuit module function specification store section 15 is disposed, as described above, to beforehand store definitions of function specifications of many known circuit module.

The operation specifications of the new definition circuit module stored in the new definition circuit module operation specification store section 14 by the designer and the function specification of the known circuit modules stored in the known circuit module function specification store section 15 are analyzed and are processed by the circuit module operation specification analyze section 18 and the circuit module network information analyze section 19 of the processing section 13.

Figure 10:
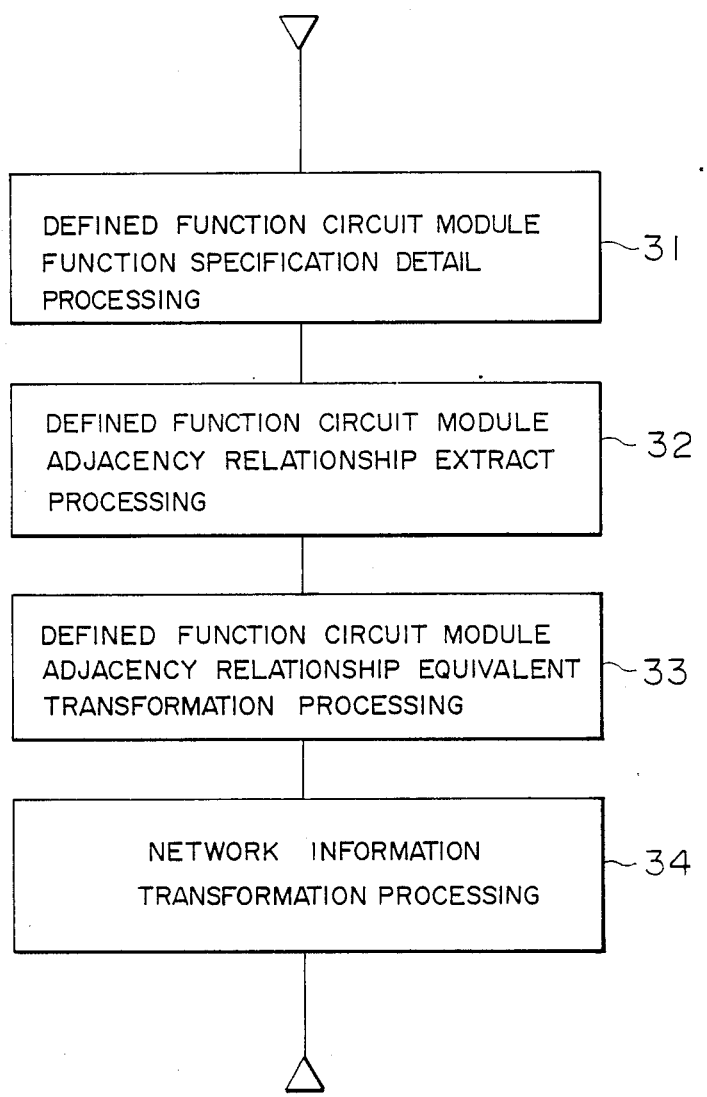
FIG. 10 is an explanatory diagram useful to explain a processing outline of a circuit module operation specific analyze section and a circuit module network information analyze section.

FIG. 10 shows processing procedures of the analyze sections 18 and 19, which will be described herebelow.

Processing 31: Since function specifications of the new definition circuit module are defined by combinations of known circuit modules, the combinations are determined by the known circuit module function specification detail processing.

Processing 32: Based on information attained by the processing 31, the known circuit module names described in the function specifications are extracted as the adjacency relationship information.

Processing 33: Subsequently, according to the known circuit module names thus attained, the function specifications of the pertinent modules are extracted from the known circuit module function specification store section 15. While analyzing adjacency relationship information, the equivalent transformation processing is effected, for example, to determine common resources of known circuit module names.

Processing 34: Finally, the adjacency relationship information having undergone the equivalent transform processing, is further converted into network information.

Through the processing above, a function circuit module is generated. In the following paragraphs, a description will be given of an embodiment of the present invention with reference to a case where an FIFO circuit module is generated.

An FIFO circuit requires a ring counter for a control thereof. Since the function specification of the ring counter has not been defined as a known circuit module, it is first necessary to generate the ring counter.

Figure 11:
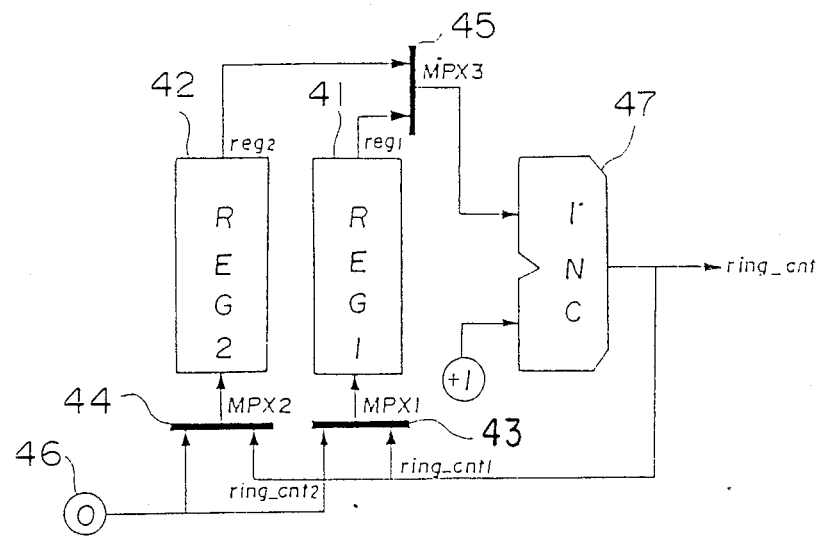
FIG. 11 is a schematic diagram depicting the hardware configuration of a ring counter.

A ring counter employed to control an FIFO is constituted, for example as shown in FIG. 11, with a combination of known circuit modules including two registers REG1 41 and REG2 42, and an incrementor INC 47 controlling the registers 41 and 42.

Figure 12:
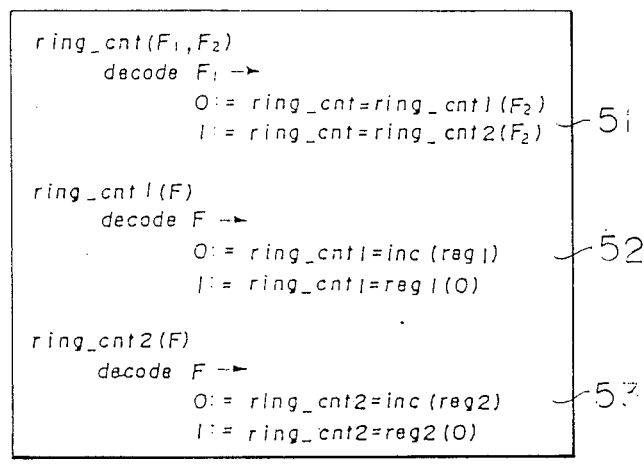
FIG. 12 is a schematic diagram showing a definition example of operation specifications of a ring

FIG. 12 shows a definition example of the operation specification of the ring counter defined by use of the operation specifications of the pertinent known circuit modules based on the configuration of this ring counter. The operation specifications thus obtained are stored in the new definition circuit module operation specification store section 14 by the designer.

In FIG. 12, an operation specification 51 defines that the ring counters ring-cnt 1 and ring-cnt 2 associated with two channels are to be changed over for the operations thereof. Operation specifications 52 and 53 define operation specifications of the ring counters of two channels including two registers reg 1 and reg 2 of the same function specification to independently keep the counter values of the ring conters and two incrementers inc's with the same circuit module name to control the two registers.

Based on the operation specifications of the new definition circuit module thus defined, the function specification detail processing (processing 31 of FIG. 10) extracts the pertinent known circuit module names, the function specifications (21 and 22 of FIG. 9 in this case) corresponding to the structure specifications of the known circuit modules are extracted from the known circuit module function specification store section 15, and then the extracted specifications are stored in the new definition circuit module detailed operation specification store section 16.

FIG. 13 shows adjacency relationship information between the known circuit modules extracted in the process in which the operation specification detail processing (processing 31 of FIG. 10) effects processing on the operation specifications of the ring counters of FIG. 12 to extract the known circuit module names and to expand or develop the operation specifications of the known circuit modules.

First, through an analysis effected on the operation specification 51 of FIG. 12, it is found that two ring counters ring-cnt 1 and ring-cnt 2 of two channels exist at a hierarchic level next to the level of ring-cnt. By analyzing the operation specifications 52 and 53 of FIG. 12, there is extracted adjacency relationship information between the incrementor inc (INC 47 of FIG. 11) controlling the count operations of the ring-cnt 1 and the ring-cnt 2, the register reg1 (REG1 41 of FIG. 11) keeping a read address, a register reg 2 (REG2 42 of FIG. 11) keeping a write address, and reset inputs reg 1 (0) and reg 2 (0) (the reset terminal 46 of FIG. 11). FIG. 13 shows the adjacency relationships in which reference numerals 67 and 68 designate reset input terminals.

FIG. 14 shows optimal adjacency relationships attained by optimizing the adjacency relationship information of FIG. 3 through the equivalent conversion or transformation.

First, since inc 63 included in ring-cnt 1 61 and inc 64 included in ring-cnt 2 62 have the same function circuit module name, inc 63 and inc 64 are unified as inc 71 to be shared between ring-cnt 1 and ring-cnt 2. As a result, for inc 71, there exist two input objects including reg 1

65 and reg 2 66 of FIG. 13; consequently, there is inserted a multiplexer mpx 3 (MPX3 45 of FIG. 11). Also for reg 1 65 of FIG. 13, there exist two control objects including ring-cnt 1 61 and reset input 0 67; consequently, a multiplexer mpx 1 (MPX1 43 of FIG. 11) is inserted. Similarly, since two control objects ring-cnt2 and a reset input 0 68 exist for reg 2 66 of FIG. 13, there is inserted a multiplexer mpx 2 (MPX2 44 of FIG. 11). In addition, the function specifications (23 of FIG. 9) of the multiplexers thus extracted are stored in the new definition circuit module detailed operation specification store section 16.

FIG. 15 shows network information extracted from the adjacency relationship information having undergone the equivalent transformation as shown in FIG. 14. These network information items are extracted by use of an algorithm to extract, from the first list of the adjacency relationship information of FIG. 14, a set of a preceding list and a subsequent list. The extracted network information is stored in the new definition circuit module network information store section 17. The network information items are represented with terminal names of a function circuit and input sources of signals supplied thereto: For example, [net-work, inc, in, mpx3] 81 of FIG. 15 specifies that inc 71 of FIG. 14 receives as an input signal the signal from mpx 3.

After the operation specification of the ring counter and the associated network information are determined as described above, the designer inputs, assuming that the ring counter has already been registered, the operation definition of the FIFO circuit from the input/output section 11 into the new definition circuit module operation specification store section 14.

Figures 16, 17:
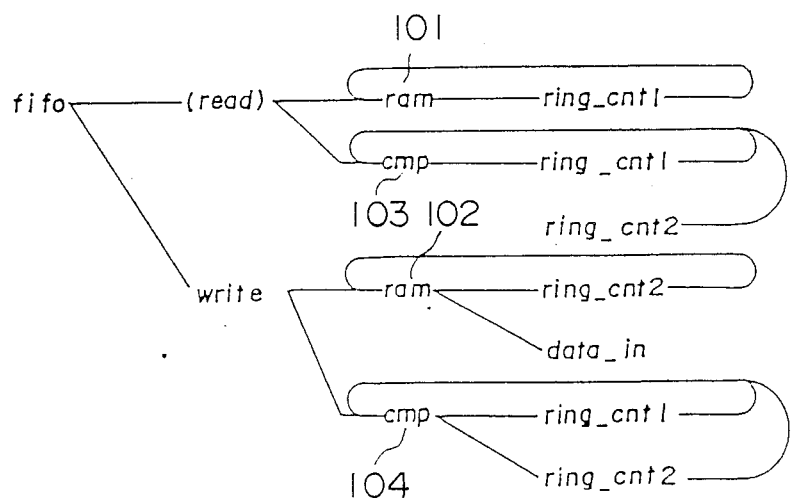
FIG. 16 is a diagram illustrating an example of operation specifications of an FIFO.
FIG. 17 is a diagram schematically showing positional relationships with respect to adjacency among known circuit modules extracted from the operation specifications of an FIFO.

FIG. 16 shows the operation definition of the FIFO circuit in which the operation specification 91 applies to a read operation of the FIFO circuit. First, a memory for the read/write operation is defined as ram like that indicated by reference numeral 25 in FIG. 9. Next, the operation specification cmp is defined to implement a function in which a read address is compared with a write address so as to notify the state of the FIFO to an external device. As a function circuit module controlling an address, the operation specification rng-cnt 1 of the ring counter already registered is defined as indicated by reference numeral 52 in FIG. 12. Similarly, the operation specification of the FIFO circuit of FIG. 16 in a write operation is also defined by use of operation specifications of known circuit modules. From the operation specifications of the new definition circuit modules thus defined, the operation specification detail processing (processing 31 of FIG. 10) extracts known circuit module names and further extracts function specifications (24 and 25 of FIG. 9 in this case) of circuit modules corresponding to the structure specifications of the pertinent known circuit modules from the known circuit module function specifications of FIG. 9, and then stores the extracted specifications in the new definition circuit module detailed operation specification store section 16.

FIG. 17 shows adjacency relationship information between known circuit modules extracted in the process in which the operation specification detail processing is effected on the FIFO of FIG. 16 to develop the detailed operation specifications of the known circuit modules. First, the operation specification 91 of the FIFO circuit of FIG. 16 in a read operation is analyzed to extract ram, which is then developed into detailed operations by use of the known circuit module ram indicated with reference numeral 25 in FIG. 9. The first parameter of ram of the operation specification 91 specifies an address of the read/write operation. In this case, ring-cnt 1 and ring-cnt 2 are specified as the addresses of the read and write operations, respectively. The second parameter is omitted because the write data is unnecessary only for the read operation. The third parameter specifies the read/write operation, namely, the read and write operations are selected for "0" and "1", respectively as indicated by the specification 25 in FIG. 9. By analyzing the next step, cmp is extracted; furthermore, through an analysis of the subsequent step, it is found that there is defined an operation to increment the value of the ring counter for controlling the read operation. Similarly, when the operation specification 92 of the FIFO circuit in a write operation is analyzed, adjacency relationship information of the FIFO circuit is attained as shown in FIG. 17. The adjacency relationship information of FIG. 17 has meanings like those of the adjacency relationship information described in conjunction with FIG. 13 with reference to a case of a ring counter.

Figures 18, 19:
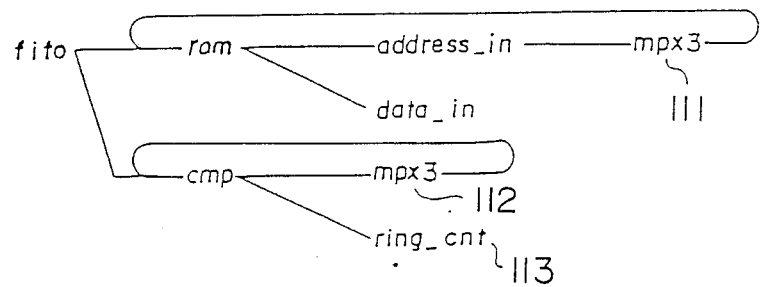
FIG. 18 is a diagram showing positional relationships with respect to adjacency among known circuit modules attained through an optimization effected on the positional relationships of FIG. 17.
FIG. 19 is a schematic diagram illustrating network information of an FIFO.

FIG. 18 shows an optimal adjacency relationship information obtained by optimizing the adjacency relationship information of FIG. 17 through an equivalent transformation. First ram 101 and ram 102 of FIG. 17 are replaced with an operation definition associated with the operation specification 25 of FIG. 9. It is found from FIG. 11 that the data items stored in reg 1 and reg 2 are assigned as address inputs and it is understood from the network information 81 of FIG. 15 that the registers are controlled by mpx 3. Consequently, as the address supply source, mpx 3 is inserted as indicated by reference numeral. 111 of FIG. 18. Since cmp 103 and cmp 104 of FIG. 17 have the same function circuit module name and are accordingly shared between the read and write operations, a unification is effected on cmp 103 and cmp 104. Thereafter, an input analysis is achieved for comp, which possesses two inputs. One of the inputs can be attained as mpx 3 like in the analysis of ring-cnt 1 and ring-cnt 2 described above, and there is inserted the mpx 3 as indicated by reference numeral 112 if FIG. 18. The other one of the inputs is obtained as ring-cnt from the network information items 82 and 83 of FIG. 15, and there is inserted the ring-cnt as indicated by reference numeral 113 in FIG. 18.

FIG. 19 shows network information extracted from the adjacency relationship information having undergone the equivalent transformation as shown in FIG. 18. The extracted network information is stored in the new definition circuit module network information store section 17.

The network information is extracted by use of an algorithm employed to extract a set of a preceding list and a succeeding list from the first list of the adjacency relationship information of FIG. 18 and is constituted in the similar fashion to that of a case described for a ring network in conjunction with FIG. 15.

Figure 20:
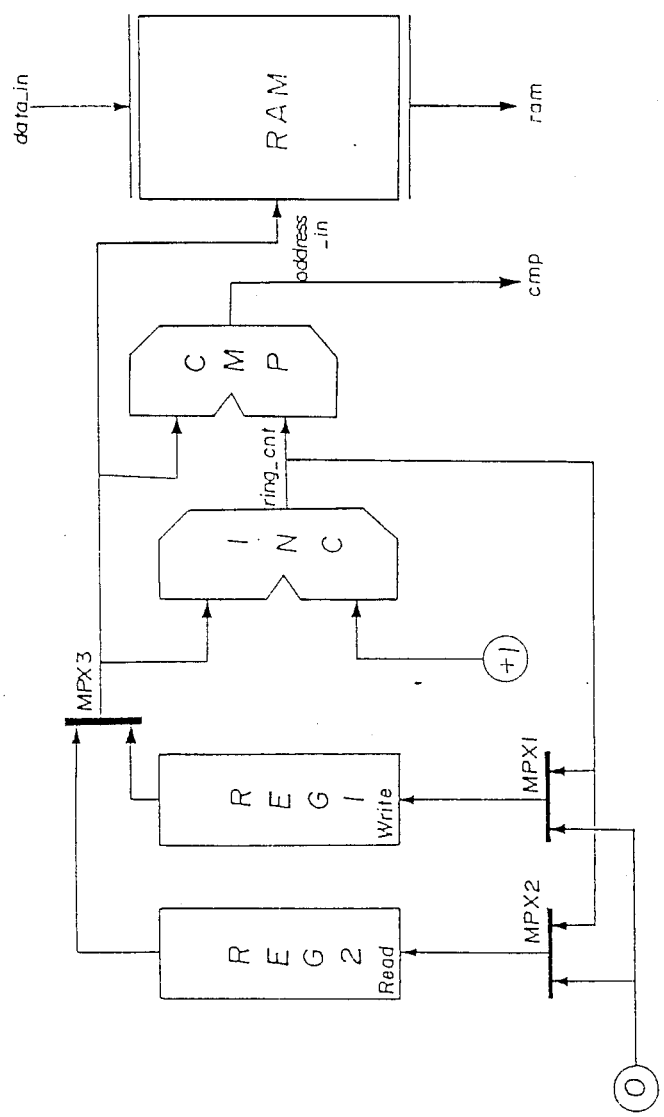
FIG. 20 is a diagram showing the hardware configuration of an FIFO.

FIG. 20 shows detailed operation information stored in the new definition circuit module detail operation store section 16 and the hardware configuration of the FIFO circuit generated by use of the network information stored in the new definition circuit module network information store section 17. This circuit is a stack operating in the first-in first-out (FIFO) method. Particularly, in a microcomputer or the like, the FIFO is provided with a function to save and to restore a return address of a program at an occurrence of a subroutine call or an interruption. The system includes a random access memory (RAM) for saving therein information of a microprocessor, registers dedicated to direct read/write operations of information stored in the RAM, and a control circuit for controlling the operation of the RAM.

Figure 21:
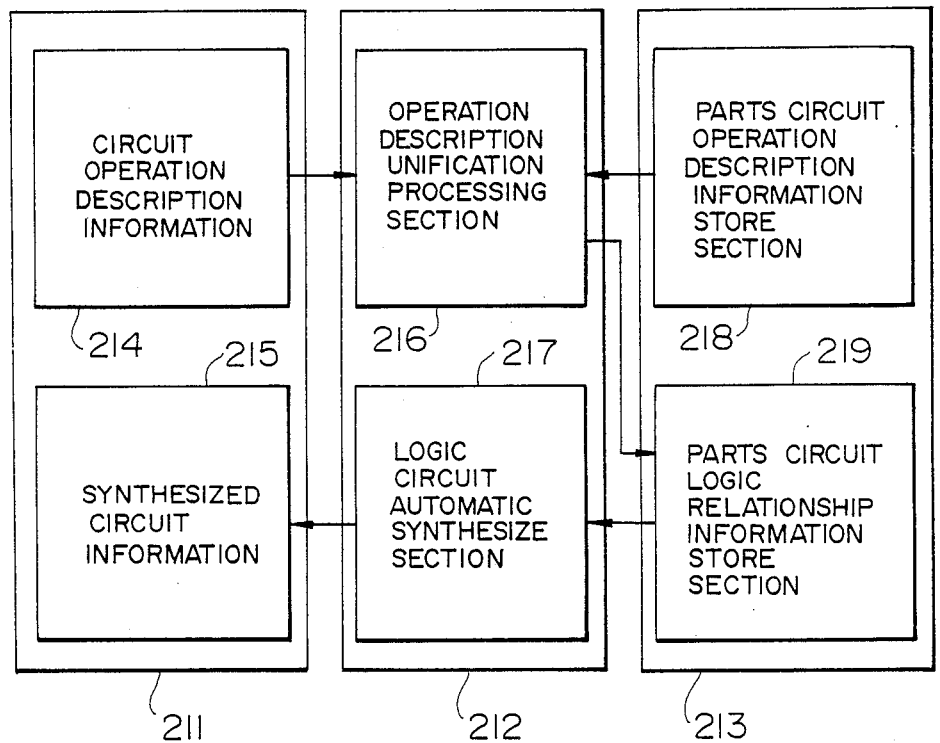
FIG. 21 is a diagram schematically illustrating the constitution of a third embodiment of an automatic design system of a logic circuit according to the present invention.

FIG. 21 shows a block diagram of a third embodiment of an automatic logic circuit design system according to the present invention. The configuration of FIG. 21 corresponds to those of FIGS. 1 and 8. For this embodiment, description will be given of an automatic design system of a function circuit module including an irregular logic circuit with reference to an example of an automatic circuit design of a stack.

When designing a circuit having a function such as a register, a counter, a stack, or a control module, namely, a function circuit module, the designer of the logic circuit in many cases refers to similar design examples and techniques employed in the past. In such a function circuit module, the number of parts circuits (a parts circuit itself is a function module) increases as the function thereof is advanced. For example, a stack comprises in most cases a counter specifying an address of the stack and an RAM storing input values. Furthermore, a control circuit module controlling a circuit operating under control of a microprogram includes in many cases a ROM storing the microprogram, a register for temporarily storing a micro instruction read out therefrom, and a stack storing a return address of the microprogram. As described above, in a case where a function module having a plurality of parts circuits is to be designed, even if only a slight change of functions is required for a design example which was completed in the past and which is quite similar to the design of the objective module, the circuits to connect the parts circuits must be designed again with consideration of the timing associated with the operations of the parts circuits and the control signals thereof.

Referring next to the drawings, a description will be given in detail of an embodiment of an automatic circuit design method according to the present invention.

The system configured in FIG. 21 automatically synthesizes a circuit which, based on operation (function) information of parts circuits constituting the function circuit module and operation description information of the overall function circuit module to be designed, connects the parts circuits so as to satisfy the specified operation specifications. With this system, accordingly, the circuit is automatically generated only by inputting operation information of the circuit module to be designed if operation information of the parts circuits are assumed to be beforehand stored in a storage section.

When designing a function circuit module, the parts circuits to constitute the circuit are beforehand determined in many cases. In addition, when designing a circuit, the design parameters such as the bit length, clock signals, operation timing, and the like of the circuit are required to be described in the operation description information of the circuit. For a circuit with such parts circuits determined, there exist relationships between the design parameters of the parts circuits and the design parameters of the circuit modules. In FIG. 21 the block elements are identified as follows. Block 211 is an input unit for this system while block 212 is a control unit for processing to produce a circuit structure. Block 215 is an output unit for producing an output of information concerning the structure produced by block 212 so as to display the information to an operator. Block 217 is a unit for synthesizing the logic circuit structure on a gate level on the basis of the parts circuit logic relationship information. Finally, block 219 stores information regarding the parts circuit logic relationship referenced in block 217.

Figure 22:
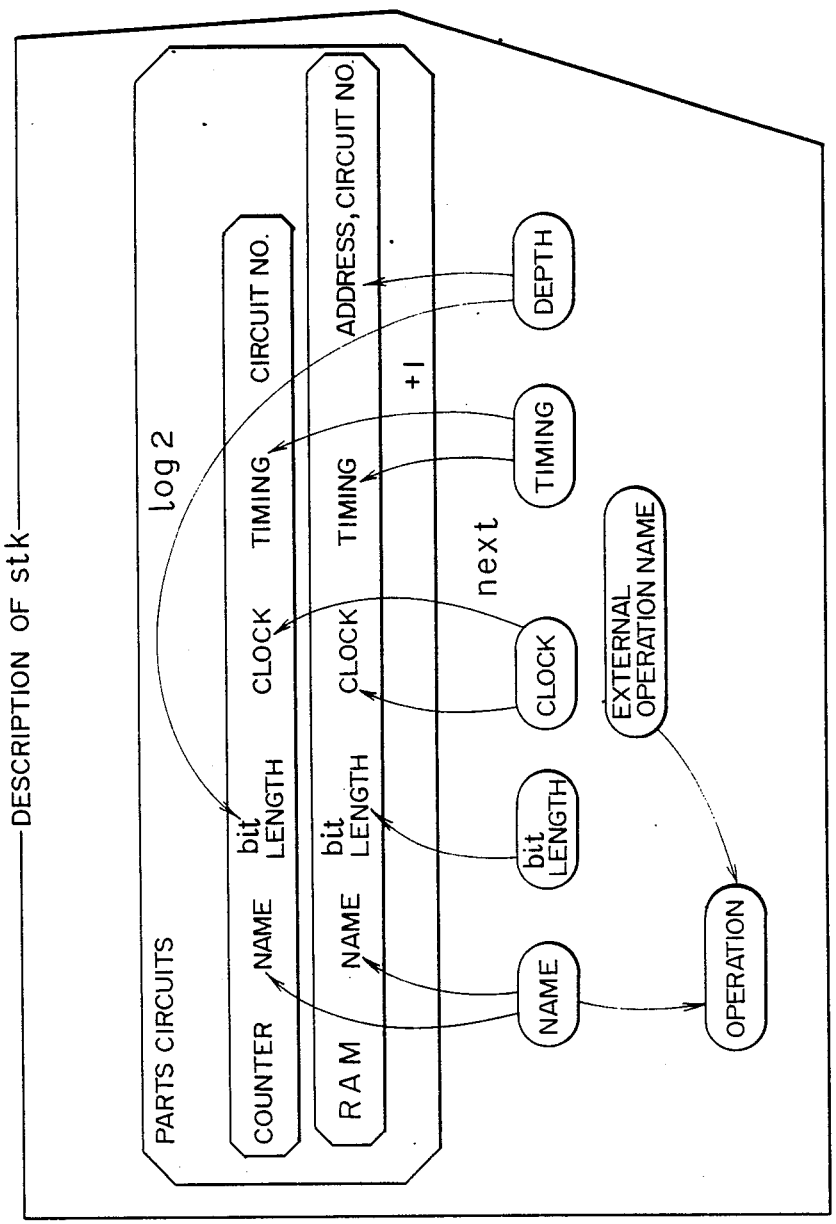
FIG. 22 is a conceptual diagram of propagation of design parameters of a stack.

FIG. 22 shows relationships between the design parameters of a stack, the design parameters of a counter as a parts circuit thereof, and the design parameters of an RAM. In FIG. 22, there are shown relationships that the stack stk includes a counter and a RAM, that the bit length of the stack stk is equivalent to that of the RAM, and that the clock signal of the RAM operation is generated subsequent to the clock signal of the stack stk. Particularly, in FIG. 22, circuit numbers in the design parameters designating the respective parts circuits are parameters which specify circuits to be selected for use from the circuit library constructed in the past. In this diagram, name, bit length, clock, timing, and depth indicate parameters are supplied by a designer. In the field of name, a name of part or constituent element, for example, counter 1 is inputted. The respective parameter values are supplied as parameters of constituent circuits such as a counter and a RAM. For example, the name of a counter specified as counter 1 is used as the name of the counter; whereas a value assigned as bit length is given as a bit length of the RAM.

Figure 23:
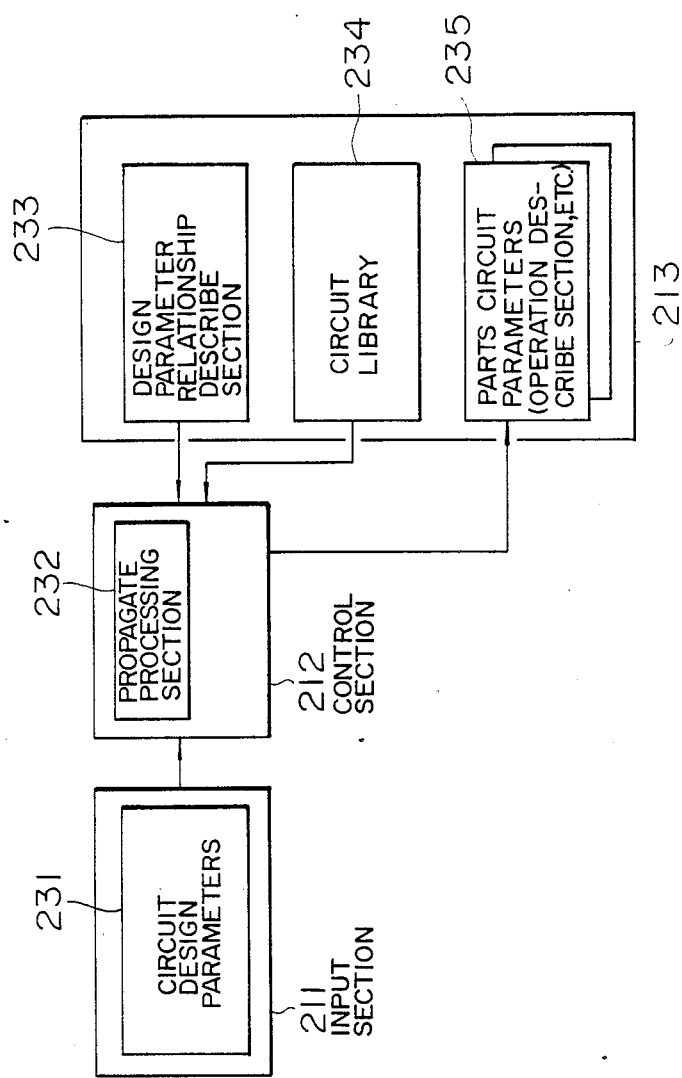
FIG. 23 is a configuration diagram of a design parameter propagate section.

FIG. 23 shows a configuration of an apparatus in which when design parameters of a circuit are inputted, operation description information of parts circuits constituting the circuit are automatically generated. In FIG. 23, a propagate processing section 232 is a portion of a unification processing section 216 of the operation descriptions of FIG. 21. Block 231 is an input unit for receiving an outputting circuit design parameters while block 235 stores parameters of the parts circuit including counters and RAM and other various circuit parts. Namely, by assigning the inputted circuit design parameters 235 (a portion of operation description information 214 of the circuit in FIG. 21) to the relationships of FIG. 22, the circuit numbers of the respective parts circuits are attained, and by referring to the circuit library 233 as a portion of the operation description information store section 218 associated with the parts circuits, operation description information of each parts circuit is generated and is stored in the store section 213.

Next, a description will be first given of an embodiment of a method of generating the operation description of each parts circuit of FIG. 23 and thereafter an embodiment of a logic circuit generating method of FIG. 21 will be described.

FIG. 24 shows an input example of operation description information 214 of the circuits in the apparatus of FIG. 21. The input information of FIG. 24 effects the definition by use of a predicate, define. In FIG. 24, reference numeral 241 indicates a definition example of a design parameter of a stack stk which is one of the function circuit modules. This is an example of a design parameter of the circuit of FIG. 23.

The first argument of the define predicate of the definition 241 in FIG. 24, namely, [stk, [0, 11]] defines that a function circuit module named stk has a bit length of 12 bits ranging from the 0th bit to the 11th bit. In addition, a list including six elements of the second argument is a portion defining the parameters necessary to generate the function circuit module. The first element [module, stc-01] of this list defines that the function circuit module is to be generated according to the relationship description specified by a number of stc-01 in the relationship description section 233 associated with the design parameters in FIG. 23. Incidentally, the function module model is related to information stored in the function module model store section of FIG. 21, namely, the operation description information store section 218 for the parts circuits, which will be described later in this specification. The second element [cntr cntrx] defines that the counter as a component of the function circuit module stk is assigned with a name of cntrx. The third element [ram ramx] defines that the RAM as a component of the function circuit module stk is assigned with a name of ramx. The fourth element [clock, phai 1] defines that a clock signal $\phi_1$ activates the function circuit module. The fifth element [depth, [0, 7]] defines that the function circuit module stk has a depth of eight addresses ranging from 0th address to the 7th address as a stack. The sixth element [timing, 1] specifies that the function circuit module stk is activated at a timing defined by an index of "1" in the operation cycle of the overall system. These six parameter definitions possess a function to transfer information necessary to generate the detailed logic circuit of the stack stk and can be regarded as arguments of subroutines.

In FIG. 24, reference numeral 242 denotes items defining operation information description information stk-behavior of the stack stk. The first argument of the define predicate of the definition 242 defines that the name of the operation is stk-behavior. The second argument := is an identifier designating that the subsequent information constitutes the operation definition part. The third argument is a portion definining the operation of the behavior-stk. A syntactical statement decode, a ,→, [N1,:=,X1,N2,:=,X2 . . . ]] means that when the value of the function circuit module (including a terminal) of A is N1, an operation of X1 is executed, and when the value of A is N2, an operation of X2 is executed (this similarly applies to N3, and subsequent specifications). Consequently, the third argument has the following meanings. Namely, when the 2-bit value [r1[0, 1]] including bit 0 and bit 1 of the register r1 is 0, the logic circuit does not effect any operation, whereas when the value is 1, and the data of the register r2 is transferred to the RAM at an address indicated by the counter contrx of ramx and the value of the counter cntrx is incremented by one. When the value is 2, the data stored at an address indicated by cntrx of ramx is outputted and then the value of the counter cntrx is decremented by one. When the value is 3, the value of the counter cntrx is reset to 0.

FIG. 25 shows an example of information description stored in the design parameter relationship description section 233 of FIG. 23. Information of the design parameter relationship description section 233 is described by use of the facet predicate. The first argument value of the facet predicate of FIG. 25 is an identifier designating that a value (not a function) is stored in the fourth argument of the design parameter relationship description information. The second argument, relationship, is an identifier indicating that the fourth argument contains design parameter relationship description information. The third argument defines that the design parameter relationship description information stored in the fourth argument is assigned with a number, stc-01. The fourth argument is a portion describing design parameter relationship description information, which is described with a list constituted with a plurality of parameter define statements or elements. The first element [module, M] of the list declares the name of the function circuit module to be generated. The module name M is here described as a prolog variable. The second element [clock, P] declares a clock signal to activate the function circuit module. The signal name P is here described as a prolog variable. The third element [depth, [S1, S2]] declares that the stack has a depth of the addresses ranging from address S1 to address S2. The fourth element [bit length, [N1, N2]] declares the bit length of the function circuit module, namely, N1 and N2 are described as prolog variables. The fifth element [cntr, C] declares the name of the counter used in the stack in which C is described as a prolog variables. The sixth element [ram, R] declares the name of the RAM used in the stack, where R is described with a prolog variable. The seventh element [timing, N] declares the operation timing of the function circuit module in the operation cycle of the overall system, where N is described with a prolog variable. The eighth element [elements, . . . ] is a list defining design parameters of the parts circuits constituting the function circuit module. In this example, the value of elements is designated by a list including design parameters of two parts circuits, where the first element declares the counter C and the second element declares RAM R. The design parameters declared here are described in the similar fashion to that employed in the case of the definition 241 of FIG. 24. Namely, there are expressed that the function circuit module C is a function module having a bit length defined by log2 ([S1, S2]), that the circuit is specified by a circuit number cnc-01 in the circuit library 234 of FIG. 23, that the clock signal for the operation thereof is next (P), and that the operation is to be effected at a timing of add 1 (N) in the operation cycle of the entire system. Incidentally, the functions log2 ([S1, S2]), next (P), and add 1 (N) are basoc built-in functions and possess the evaluated values of their own. Namely, log 2 ([S1, S2]) possesses an evaluation value of [0, X1] for X1=[log 2 (S2−S1+1)]+1, where a value in the Gaussian symbol, [n] indicates an integer value not exceeding the value of n. This is used to describe the relationship between the bit length of the address of a memory such as an RAM and the memory capacity. The function next (P) has, as an evaluation value, the clock signal generated at the next timing of the timing associated with the clock signal P. For example, for the system in which clocks of two phases defined by $\phi_1$ and $\phi_2$ as clock signals are used, next ($\phi_1$) has $\phi_2$ as an evaluation value. The function and 1 (N) possesses N+1 as an evaluation value.

Similarly, for RAM R, the description is effected with [[R, [S1, S2], . . . ] as shown in the diagram.

As described above, design parameter relationship description information defines the relationships between the design parameters of the function circuit module and those of the parts circuits by means of the prolog variables and basic built-in functions. In addition, the prolog variable can be regarded as a local variable which can be changed in the relationship description.

Definition 261 of FIG. 26 defines a circuit specified with a circuit number cnc-ol in the circuit library 234 of FIG. 23, where design parameters of module, clock, timing, and bit-length are defined in the similar fashion to that described above.

The operation description section 262 defines operations that when the value inputted to the 2-bit control-in terminal is 0, the logic circuit does not achieve any operation, that when the inputted value is 1, the value of M is incremented by one, that when the input value is 2, the value of M is decremented by one, and when the input value is 3, the value of M is reset to 0.

The definition item 263 of FIG. 26 defines the circuit specified by a circuit number rac-01. The specifications of module, bit-length, clock, timing, and address are defined in a similar fashion to that described above. Furthermore, arguments are described to define that an argument A is necessary when the function module is described. Moreover, there is defined that the value to be possessed by the function module supplied through the argument A by use of the assign specification is inputted via the input terminal address-in. The operation description section 264 further defines the operation that when the value inputted to the 1-bit control-in terminal is 0, the RAM does not effect any operation and that when the inputted value is 1, an operation of [f (M, A), =, in] is to be executed. Incidentally, f {A1, A2, ..., An} is a basic built-in function having A1 (A2, .. ., An) as an evaluation value. For example, the evaluation value of f(ramx, A) is ramx(A), namely, [ramx(r1), =, in] means that the value supplied from in is stored at an address ramx of which the value is stored in r1.

Figure 27:
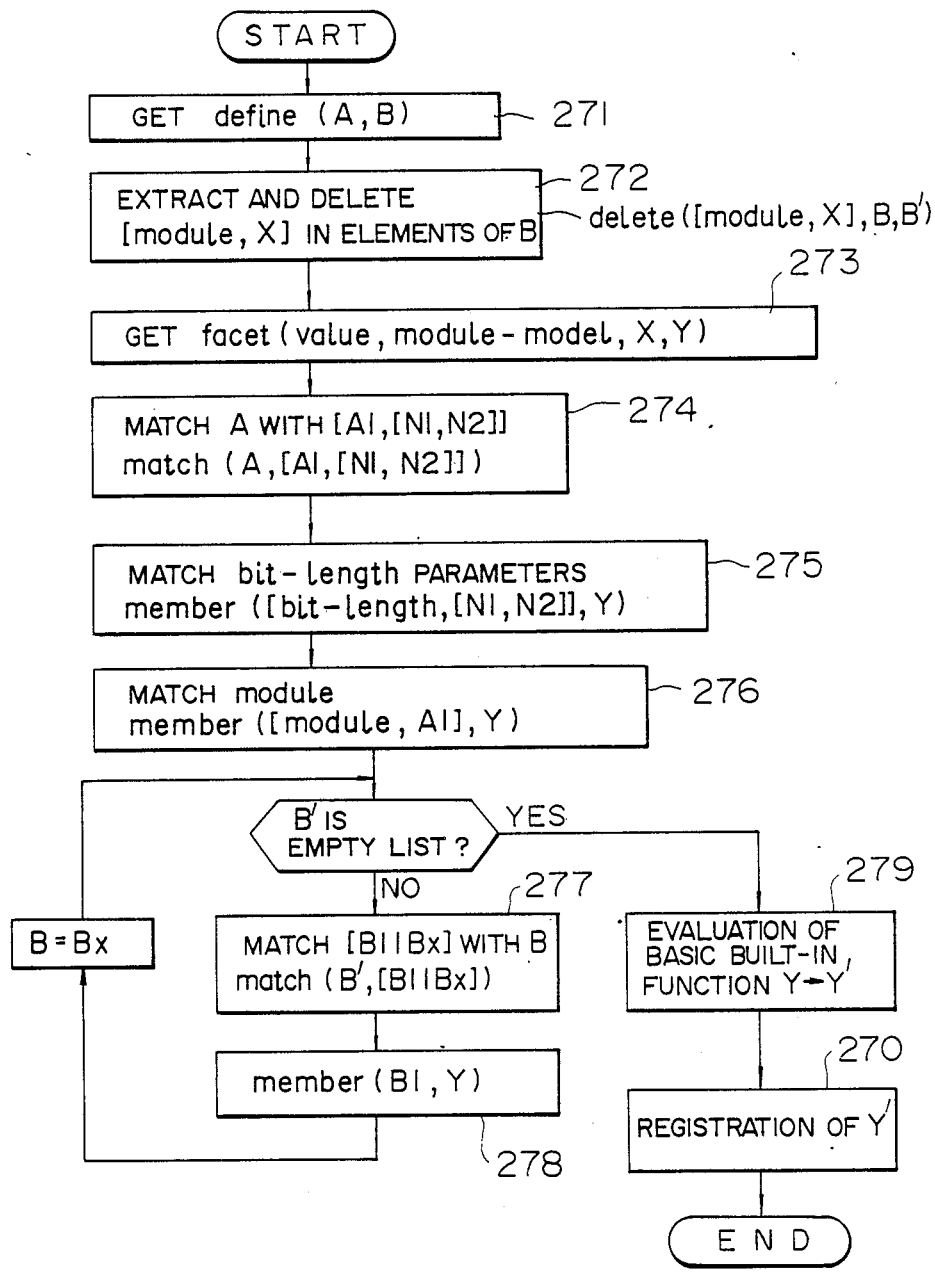
FIG. 27 is a flowchart of a propagate processing.

The system of which the configuration is shown in FIG. 23 generates operation description of the parts circuits based on information inputted as design parameters, information of design parameter relationship description section, and information stored in the circuit library. FIG. 27 shows a flowchart of operations of the propagate processing section 232 of FIG. 23.

Next, according to FIG. 27, an embodiment will be described with reference to operations automatically generating detailed information of a stack stk from stack operation description information and design parameter relationship description information defined in FIGS. 24 to 26.

(1) First, processing 271 reads out, from the specification store section storing the specification of the logic circuit, information defining design parameters of the function circuit module. In this case, the information thus read out includes information declaring the stack stk of the definition 241 of FIG. 24.

(2) Next, processing is executed to match the design parameter information items of the function circuit module attained in the processing 271. Processing 272 and the subsequent processing comprise detailed matching processing of the information 233 about the design parameter relation description section of FIG. 23.

Information read out in the processing 271 includes information, like the first element [module, stk-01] of the second argument list appearing in the definition 241 of FIG. 24, to declare relationship description information of design parameters to be necessarily used. In the processing 272, [module, X] (X is a prolog variable) is removed from the second argument list of the define predicate appearing in the definition 241 of FIG. 24, and the result of the removal operation is unified with a prolog variable B. Furthermore, a function module name stk-01 is also unified with the prolog variable X.

(3) Thereafter, in processing 273, information about the function circuit module stk-01, namely, the list of the fourth argument of the facet predicate of FIG. 25 is unified with the prolog variable Y.

Provision of the list unified with the prolog variable Y, namely, the unification of the values of the prolog variables used in the list of the fourth argument of the facet predicate of FIG. 25 enables detailed information of design parameter information of the parts circuits to be generated. Processing steps 274 to 278 of FIG. 27 constitute a processing part unifying the list information unified with the prolog variable B with prolog variables used in the list unified with the prolog variable Y.

(4) The processing 274 extracts the function circuit module name and the bit length of the function circuit module in which A1, N1, and N2 are unified with stk, 0, and 11, respectively.

(5) Processing 275 unifies [N1, N2] ([0, 11] in this case) with the prolog variable specifying the bit length of the function circuit module in the elements of the list unified with Y. In this description, member (A, B) is a function defined as follows in the prolog.

member (A, [A/AA]).
member (A, [B/AA]): -member (A, AA).

Consequently, a function circuit module model unified with Y through a processing of member ([bit-length, [N1, N2], Y) can be unified with the value [0, 11] of the bit length.

(6) Processing 276 unifies A1 (stk in this case) with a prolog variable (M in the definition 241 of FIG. 24) representing the name of the function circuit module in the list expressing the function circuit module model unified with Y. Also in this operation, the module name can be unified through an execution of a function member ([module, A1], Y).

(7) In this stage, the unify value B has already been unified with a value of [[cntr, cntrx], [ram, ramx], [clock, phail], [depth, [0, 7]], [timing, 1]]. That is, since B is not an empty list, processing 277 is executed, where match is a function defined by match (X, X). Processing of match (B', [B1BX]) causes the value of [cntr, cntrx] to be unified with Bl and the remaining list of B to be unified with BX. In processing 278, the value of cntrx is unified with a prolog variable (C in FIG. 25) representing the name of the counter module which is an element of function module model information unified with Y when member ([cntr, cntrx], Y) is effected. In this situation, Bx has been unified with the value of [ram, ramx], [clock, phail], [depth, [0, 7]], [timing, 1]], which is here unified with B. Since B is not an empty list, control returns again to the processing 277 in which a list of [ram, ramx] is extracted from B, and member ([ram, ramx], Y) is processed such that the value of ramx is unified with a prolog variable (R is FIG. 25) representing the name of the RAM module which is an element of function module model information unified with Y. Subsequently, through the similar procedure, the value of phai 1 is unified with a prolog variable (P in FIG. 25) representing the clock signal in the function module model information unified with Y; the value of [0, 7] is unified with a prolog variable ([S1, S2] in FIG. 25) representing the depth of the stack; and the value of 1 is unified with a prolog variable (N in FIG. 25) representing the timing information to be activated in the operation cycle of the overall system.

(8) Since BX becomes to be an empty list at this moment and hence B is also an empty list, the system then initiates execution of processing 279 to effect an evaluation of the basic built-in function. In this situation, Y has been unified with the following value.

[[module, stc], [clock, phai 11], [depth, 0, 7]],
[bit-length, [0, 11]], [cntr, cntrx], [ram, ramx],
[timing, 1], [operation, behavior-stk],
[elements, [[[cntrx, log 2 ([0, 7])],
[[module, cnc-01], [clock, next (phail)],
[timing, add 1 (1)]]]
[[ramx, [0, 11]],
[[module, rac-01], [clock phail],

[timing, 1], [address, [0, 7]]]]]]

In processing 279, the function add 1 (1) is replaced with a binary value. If this description is described in a general form as addn (m), where n and m are constant, the value n+m is used for the replacement. Similarly, for example, subn (m) and next (phai 1) are replaced with m−n and the clock signal generated next to phai 1, respectively.

In addition, for example, log 2 ([0, 1023]) is replaced with [0, 9], which means that the signal lines necessary to specify addresses in a memory with a memory capacity ranging from address 0 to address 1023 are constituted with 10 bits represented as [0, 9]. Consequently, log 2 ([N1, N2]) is a function to extract a bit configuration of the address signal lines for the memory having a memory capacity ranging from N1 to N2.

Figure 28:
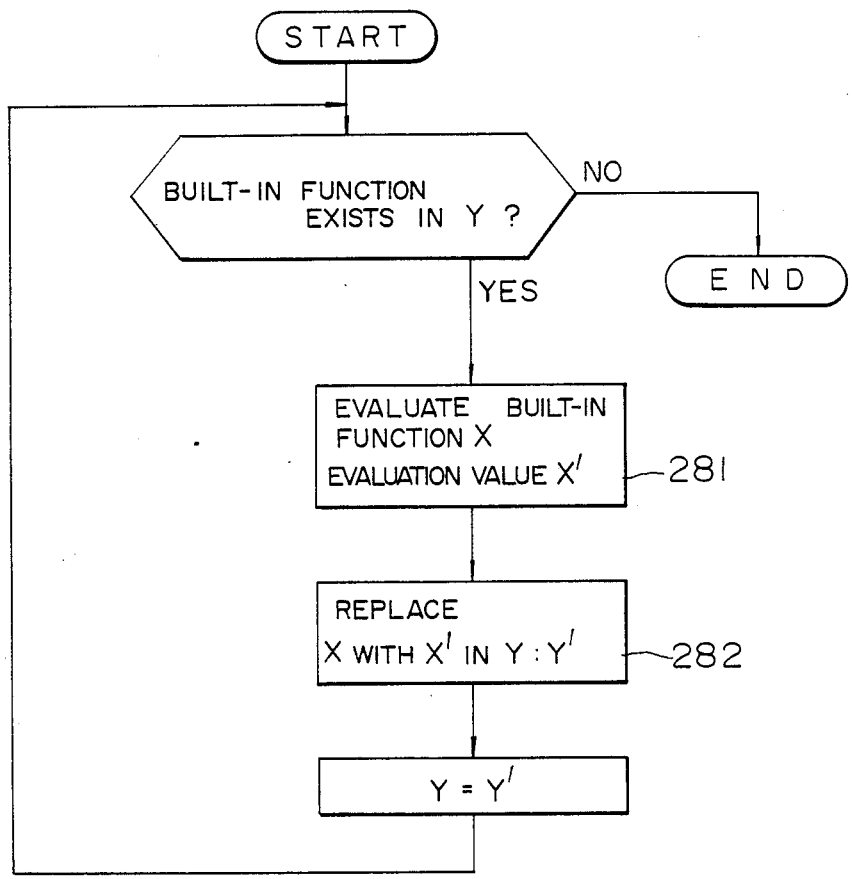
FIG. 28 is a flowchart of a built-in function evaluate processing.

FIG. 28 describes in detail an evaluate processing to evaluate the built-in function in the processing 279 of FIG. 27. In a case where the built-in function X exists in Y, according to the expression described above, the evaluation value of log 2 ([0, 7]) is [0, 2], and any log 2 ([0, 7]) described in the list unified with Y is replaced with the value of [0, 2]. Similarly, the value of next (phai 1) described in the list unified with Y is replaced with the evaluation value phai 2, and add 1 (1) is replaced with the evaluation value 2. The evaluation and replacement are accomplished in processing steps 281 and 282 of FIG. 28.

As a result of the processing above, the prolog variable Y' in the processing 279 is unified with detailed information necessary to generate the function circuit module stk. Namely, Y' is unified with the following values.
[[modules, stk], [clock, phai 1], [depth, [0, 7]],
[bit-length, [0, 11]], [cntr, cntrx],
[ram, ramx], [timing, 1],
[operation, behavior-stk],
[elements, [[[cntrx, [0, 2]],
[[module, cnc-01], [clock, phai 2], [timing, 2]]],
[[ramx, (0, 11]], [[module, rac-01],
[clock, phai 1], [timing 1], [address, [0, 7]]]]
Thereafter, the value unified with Y' is registered in the processing 270 of FIG. 27.

Figure 29:
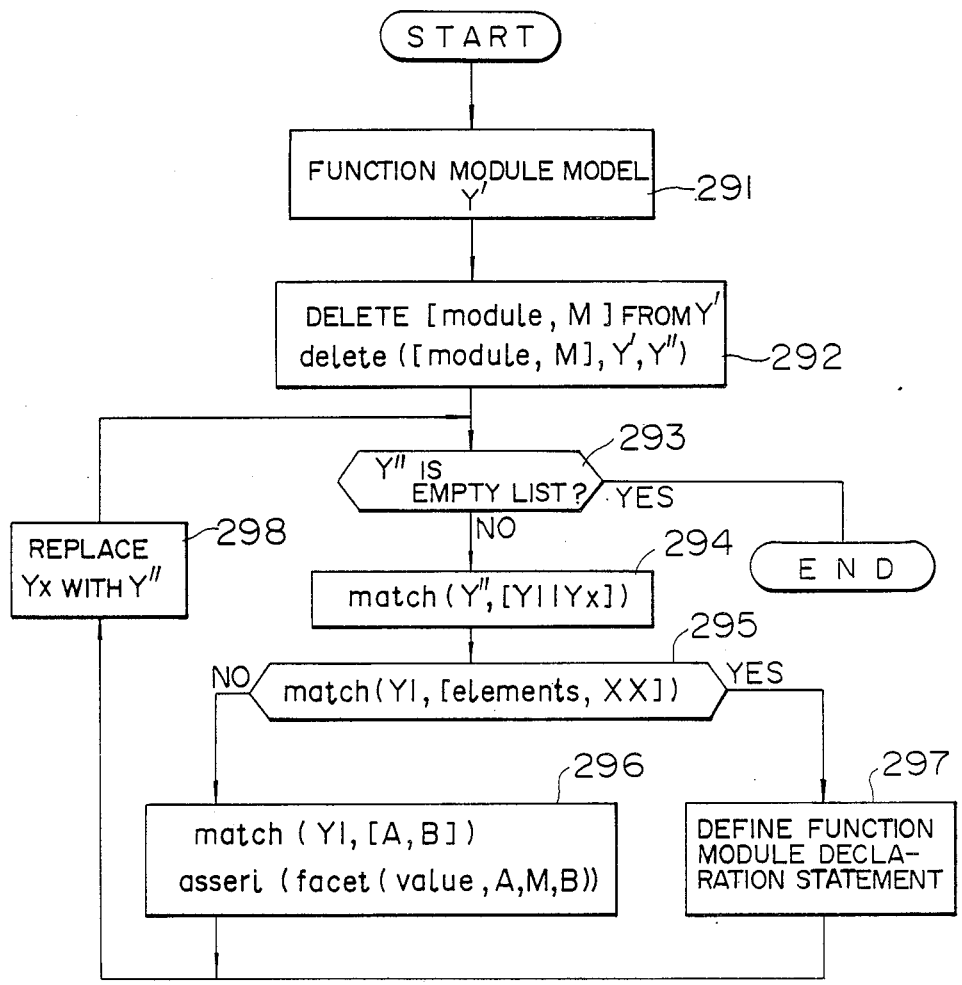
FIG. 29 is a flowchart of a register processing of Y'.

FIG. 29 shows in detail the processing to register the information of Y', which will be described hereinbelow.

(1) First, the element having a structure of [module, M] is deleted from the list unified with Y'. The attained value is then unified with a prolog variable Y". In this processing, the value stk is unified with the prolog variable M (processing steps 291 and 292).

(2) Since Y" is not empty, the first element [clock, phai 1] of the list unified with Y" is extracted so as to declare a function of facet (value, clock, stk, phai 1), and the remaining list (the value unified with Yx) is analyzed Subsequently, in the similar processing, the values of depth, bit-length, cntr, ram, and timing are sequentially declared by use of facet predicates (processing steps 293 to 296 and step 298). In step 293 the judgement is made as to whether the variable Y" is an empty list. When the result is YES, processing is completed. The match function in step 294 is defined by matxh (x,x( in Prologue. In step 294, the value unified with the variable Y" is unified with [Y1-Yx] of the variable list so as to extract the first element. The first element is unified with the variable Y1. In step 295, the value unified with Y1 is unified with the [elements, XX] of the variable list so that the value stored in the elements slot is unified with the XX. Then the value of the element slots can be extracted. When the unification was a failure, the process is followed by step 296. When the unification is successful than step 297 is carried out. The value stored in the element slots are data about the parts circuits of the modular M. In step 297, the data are registered per each of the parts circuit as declaration statement of the function module. Every parts circuit frame can be produced by using the process in FIG. 29.

(3) When information defining an element is attained as the first element of Y' (information of [elements, ... ]), the following definition is declared to define cntrx.
([cntrx, [0, 2]],
[[module, cnc-01], [clock, phai 2],
[timing, 2]).
And then, ramx is defined through a declaration of
define ([ramx, [0, 11]),
[[module, rac-01], [clock, phai 1],
[timing, 1], [address, [0, 7]]])
thereby completing the processing (processing 297). In step 298 the value unified with YX is reunified with Y"'.

FIG. 30 shows design parameters of two parts circuits cntrx and ramx of the function circuit module stk attained by using the algorithm above in the detail processing.

Assuming that the design parameters attained for the parts circuits constitute design parameter relationship description of the circuit library of FIG. 26, the processing of FIG. 27 can be executed again to obtain detailed information of the information about the parts circuits. Namely, the circuit library of FIG. 26 contains information describing relationships between the design parameters and the operation description information, and hence by applying the processing of FIG. 27 thereto, the detailed operation description of the respective parts circuits can be obtained. Consequently, FIG. 30 shows design parameters and operation description information items for the two parts circuits of stk attained from the processing of FIG. 27.

Description has been given of the embodiment in which a processing is effected to generate operation description information of the parts circuits from the design parameter information of FIG. 23.

Next, description will be given of an embodiment of a circuit design system having the configuration of FIG. 21.

Referring now to the circuit synthesize apparatus of FIG. 21, an embodiment will be described in which a function module stk is synthesized from circuit operation description information of FIG. 24 and operation description information of parts circuits of FIG. 30.

Figure 31:
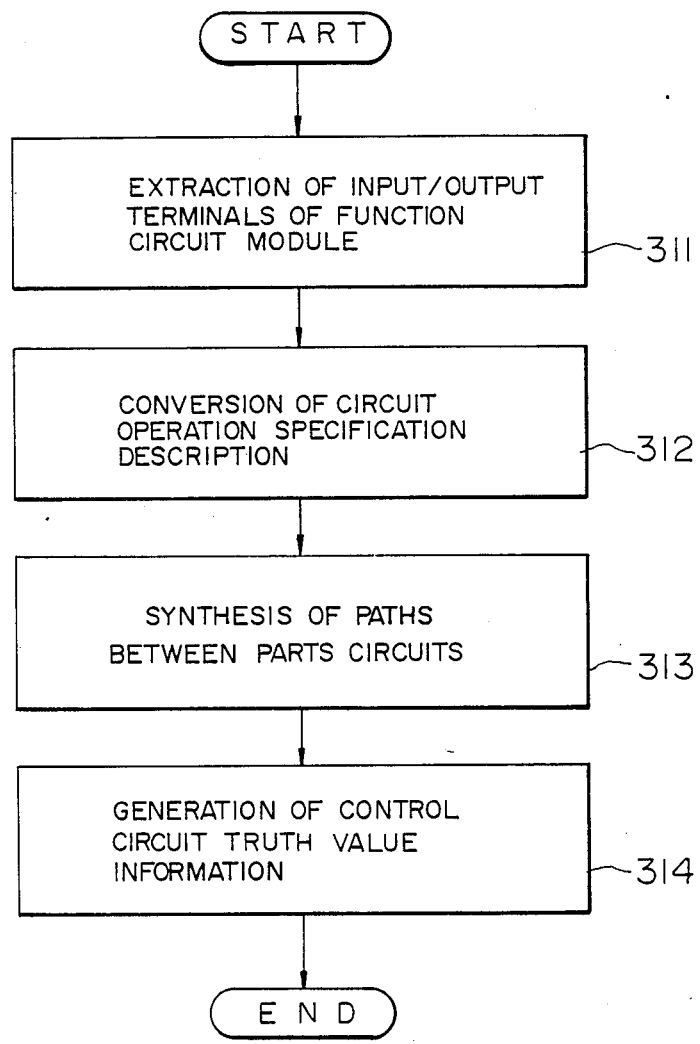
FIG. 31 is a flowchart of a unification processing of operation descriptions.

FIG. 31 shows processing steps of the unification processing part to be effected on operation descriptions of FIG. 21.

Operation description information of the function module stk in the definition 242 of FIG. 24 includes registers r1 and r2 disposed externally with respect to the stack. Namely, the register r1 is connected to the stack stk via an external terminal. Processing 311 effects, when the circuit operation description information thus inputted includes a function circuit module located outside the circuit, a synthesis (an extraction) of external terminals of the circuit to be located between the circuit and the function circuit module. Furthermore, in processing 312, all external circuits obtained from the supplied circuit operation description information are replaced with intervenient external terminals so as to convert the information into operation information completely valid in the circuit.

This flowchart includes a processing step to extract external terminals of a circuit, a processing step to convert the external terminals employed in a circuit operation description into a representation of internal terminals, a processing step to establish connections between circuit modules, and a processing step to create a truth value representation associated with relationships between the inputs and outputs of the control circuit.

Figure 32:
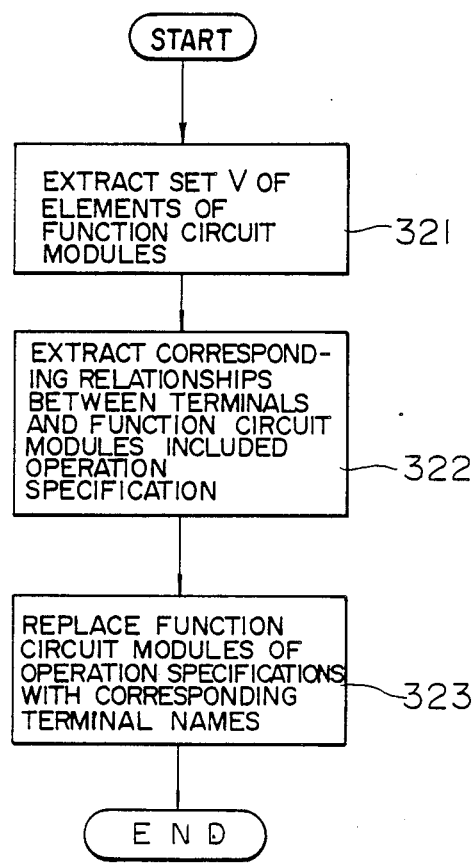
FIG. 32 is a flowchart of input/output terminal extract processing of a circuit.

FIG. 32 shows details of the processing steps 311 and 312. That is, the processing steps 321 and 322 of FIG. 32 correspond to the processing 311 of FIG. 31, and the processing 323 is associated with the processing 312.

In the list of the third argument of the definition 242 of FIG. 24, there is not contained an item called a function circuit module stk; consequently, processing 321 is initiated. The processing 321 extracts a set V of the parts circuits constituting the function circuit module stk. Since the function circuit module stk comprises two function modules cntrx and ramx, a value [cntrx, ramx] is unified with V. Next, control is passed to processing 322 to establish correspondences between the input/output terminals and function modules included in the operation specifications.

Figure 33:
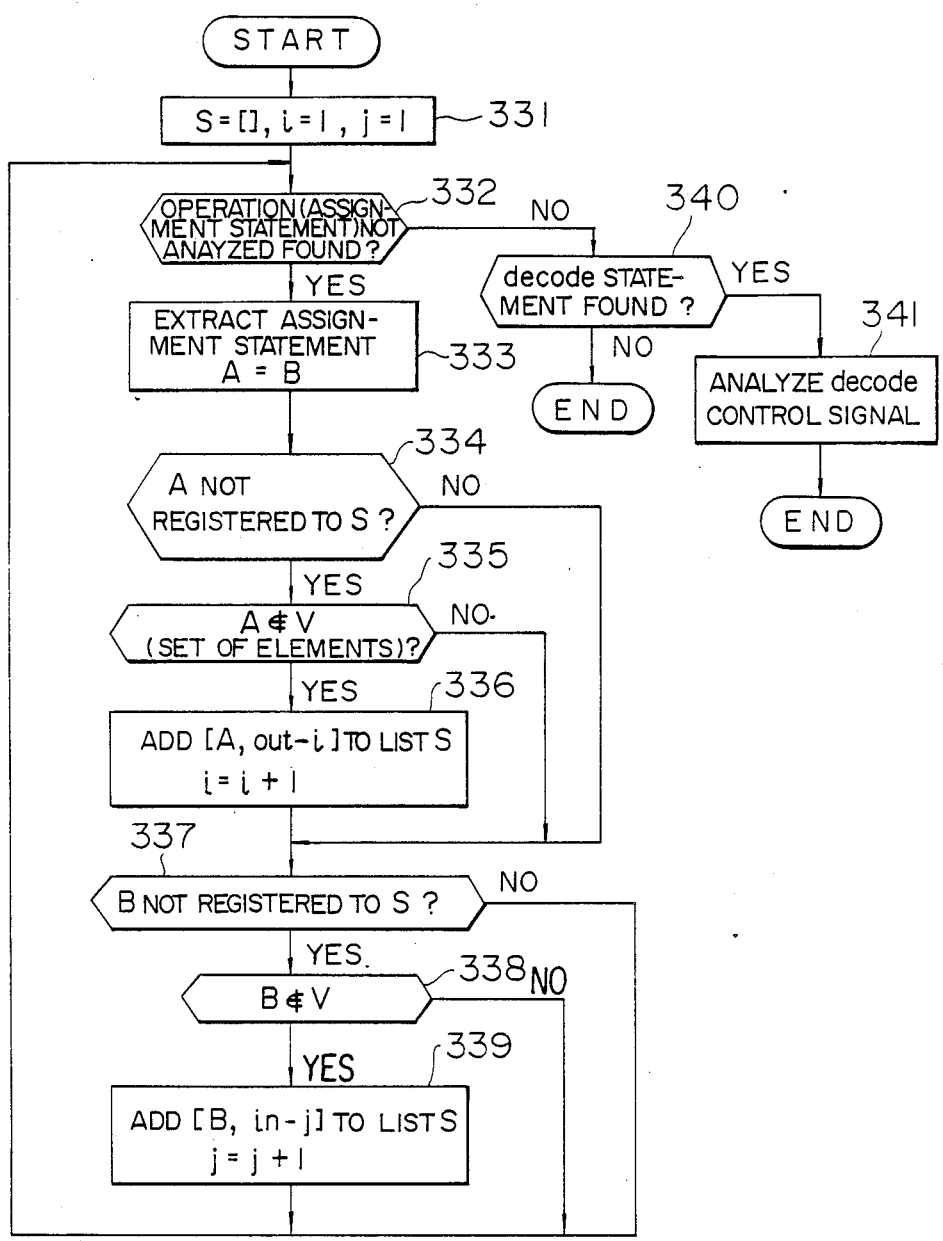
FIG. 33 is a flowchart of a terminal correspondence processing.

FIG. 33 shows detailed descriptions of the processing above.

The algorithm of FIG. 33 converts the operation descriptions (the definition 242 of FIG. 24) described with four function modules stk, r1, r2, and r3 into relationship (operation) descriptions associated with stk and input/output terminals out1, in1, and control-in1 of stk. With this algorithm, the operation descriptions are converted into function descriptions to be satisfied by stk.

First, in the processing 331, the value of list S is set to an empty list []. Next, it is judged whether or not there exists an assignment statement (in the form of A=B) or (in the form of a function form X(...)) in the operation descriptions of the definition 242 of FIG. 24. In this case, control proceeds to the processing 333 since the following assignment statements have not been analyzed yet.

"ramx(cntrx), =, r2"
"r3, =, ramx(cntrx)"

The processing 333 extracts the assignment statement "ramx(cntrx), =r2" not analyzed yet. Next, processing 334 judges whether or not ramx is an element of the list S. When the value unified with A has not been registered in list S step 337 follows step 334. Since the list S is here an empty list, ramx is not an element of S. As a result, control proceeds to processing 335, which then judges whether or not ramx is an element of V=[cntrx, ramx] extracted in the processing 321 of FIG. 32. Since ramx is an element of V, control is passed to processing 337, which in turn executes an analysis of the right side of the expression extracted in the processing 333. First, it is judged whether or not r2 is an element of S=[]. Since information of r2 has not been registered to S, control proceeds to processing 338, which then judges whether or not r2 is an element of V=[cntrx, ramx]. Since r2 is not an element of V, processing 339 is executed. The processing 339 contains a description of the corresponding relationships between external modules and input terminals, and [r1, in1] is added as an element of S=[] and the value of i is changed to 2. Thereafter, the processing 332 is executed again. In step 337 if the value unified with B has not been registered in list S than step 332 is begun. Since there also remains the assignment statement not analyzed yet as follows "r3=ramx(cntrx)"

control proceeds to the processing 333, which then extracts the assignment statement "r3=ramx(cntrx)"

In the processing 334, it is judged whether or not information of r3 has been registered as S=[[r1, in1]]. Since information of r3 has not been registered to S, control proceeds to processing 335, which then judges whether or not r3 is an element of V=[cntrx, ramx]. Since r3 is not an element of V, processing 336 is executed so as to register [r3, out1] to S. Next, it is judged whether or not [ramx, outx] has been registered to S. Since [ramx, outx] has not been registered to S, control is transferred to processing 338. Subsequently, since ramx is an element of V=[cntrx, ramx], control proceeds to the processing 332. Since there does not exist any assignment statement not analyzed yet, control is passed to processing 340. In step 340 when the decode statement has not been found, the process is ended. Since the operation description of the definition 242 in FIG. 24 includes a decode statement, control proceeds to processing 341. In this situation, signals associated with bits 0 and 1 control the decode statement. Since r1ϕV; [[r1, [0, 1]], control-in1] is added to S, which finally comprises

[[r2, in1], [t3, out1],
[[r1, [0, 1]], control-in
1]] thereby completing the processing of FIG. 33.

Figures 34, 35:
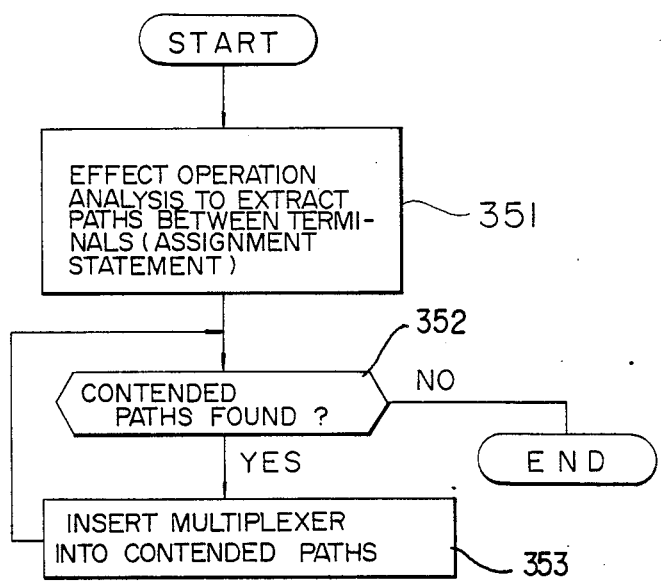
FIG. 34 is a schematic diagram showing an example of generated net information.
FIG. 35 is a flowchart of a processing to combine paths between parts circuits.

FIG. 34 shows the conversion results form the processing above in which link ([stk, in1], [r2, out]) describes that the input terminal in1 of stk is to be connected to the output terminal out of r2, whereas link ([stk, control-in], [r1, [0, 1]]) specifies that the control input signal control-in of stk is connected to bits 0 and 1 of r1. Similarly link ([stk, out1], [r3, in]) specifies that the output terminal out of stk is connected to the input terminal in of r3.

Next, in the processing 313 of FIG. 31, a path synthesize algorithm is initiated to synthesize paths between parts circuits. FIG. 35 is a flowchart of detailed operations of the path synthesize algorithm.

First, processing 351 extracts assignment statements (operations including data transfers between at least two modules) from the operation specification description through the unification. Namely, [ramx (cntrx), =, in] is first extracted. In this operation, it is extracted through the unification that there are required a path from [stk, in] to [ram, in] and a path from [cntrx, out] to [ramx, addres-in]. Next, an assignment statement of [out, =, ramx(cntrx)] is extracted by the unification. Similarly, through an analysis, it is extracted that a path from [ramx, out]to [stk, out] and a path from [cntrx, out] to [ramx, address-in] are necessary. Consequently, in processing 351, it is extracted that the following three paths are necessary as internal paths of stk.

[stk, in]→[ramx, in]
[cntrx, out]→[ramx, address-in]
[ramx, out]→[stk, out]

These three paths have different output destinations, respectively, and hence there does not arise any contention therebetween. Consequently, the three paths are directly employed as internal wiring information of stk.

Figures 36, 37:
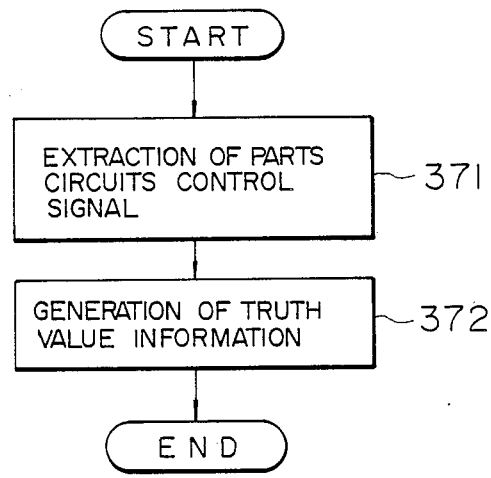
FIG. 36 is a diagram showing generated paths between parts circuits.
FIG. 37 is a flowchart of a processing to generate control circuit truth value information.

FIG. 36 shows the internal wiring information of stk, which can also be interpreted in a fashion similar to that of the case of FIG. 34, namely, connections between terminals in stk are described.

Figure 38:
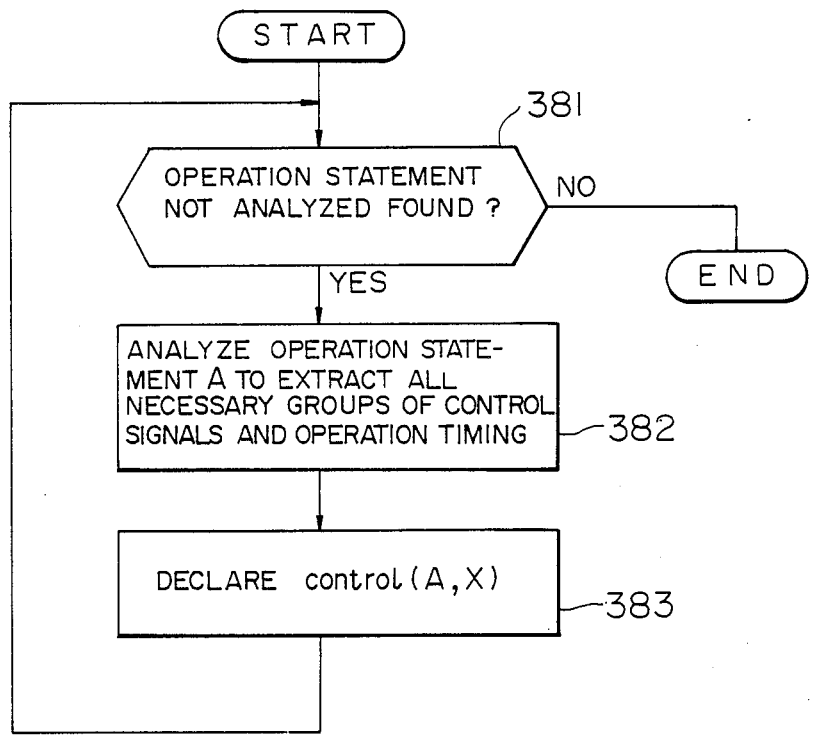
FIG. 38 is a flowchart of a control signal extract processing of a part circuit.

Next, processing 314 of FIG. 31 is initiated, namely, the processing of the truth value table generate section of the control circuit is activated. FIG. 37 shows details of the processing 314, whereas FIG. 38 shows details of the processing 371 of FIG. 37.

First, in the processing 371, operation statements (assignment statements and operation statements of the function circuit module) are extracted from the operation description of the function circuit module. In the example of the function circuit module stk, noop is first extracted as an operation statement. In order to effect the noop operation in stk, it is necessary to send the noop signal to the function modules ramx and cntrx constituting stk. In order to effect noop on ramx, it is extracted from information indicated with reference numeral 302 in FIG. 30 that a 0 signal is inputted to the [ramx, control-in] terminal at a timing 1 and to the [sntrx, control-in] terminal at a timing 2. Consequently, in the processing steps 381 and 382 of FIG. 38, for the noop operation, X is unified with the value of

[[1, [[ramx, control-in], =0]],
[2[[cntrx, control-in],
[=, 0]]] In step 381 when the operation statement not analyzed has been found, the process is completed. In the processing 383, the value is declared in association with the noop operation by use of a control predicate. Subsequently, [ramx (cntrx), =, in] is extracted as an operation. In order to execute this operation, it can be extracted from information 302 of FIG. 30 that the [ramx, control-in] terminal need only be supplied with 1 at a timing 1. This value is also declared by use of a control predicate. Next, [cntrx, =, [cntrx, +, 1]] is extracted as an operation. In order to execute this operation, it is extracted from information 301 of FIG. 30 that the [cntrx, control-in] terminal need only be supplied with 1 at a timing 2. Similarly, this value is also declared by use of a control predicate. Next, [cntrx, =, [cntrx, -, 1]] is extracted as an operation. In order to execute this operation, it is extracted from information 301 of FIG. 30 that the [cntrx, control-in] terminal need only be supplied with 2 at a timing 2. This value is also declared by use of a control predicate.

Next, [cntrx, =, 0] is extracted as an operation. In order to execute this operation, it is extracted from information 301 of FIG. 30 that the [cntrx, control-in] terminal need only be supplied with 3 at a timing 2. This value is similarly declared by use of a control predicate. FIG. 39 shows information representing relationships between timing items and control signals attained through the processing above.

In the first free line of this description, since a control signal for executing noop (no-operation) is unnecessary, the control signal is represented as an empty list. Furthermore, it is indicated in the second entry that in order to execute

[[ramx(cntrx),=,in]next,
[cntrx,=,[cntrx,t,1]]
[[ramx,control-in],=1] and [[cntrx, control-in],=,1]] need only be produced at timings 1 and 2, respectively. In addition, the third entry indicates that for an execution of

[[out,=,ramx)cntrx]],next,
[cntrx,=,[cntrx,-,1]])
[[cntr,control-in],=2] need only be executed at the timing 2. Moreover, the fourth entry indicates that in order to execute [cntrx,=0], [[cntrx, control-in],=3]]) need only be generated as a control signal.

Figure 40:
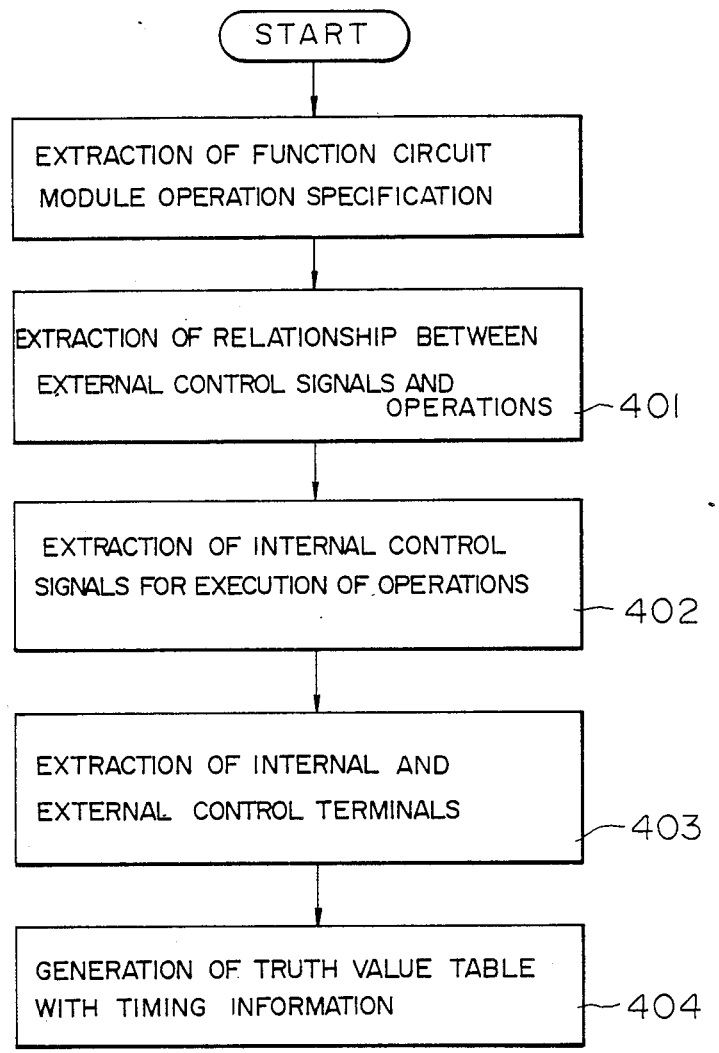
FIG. 40 is a flowchart of a truth value information generate processing.

Subsequently, control is passed to processing of the truth value information generate part of the processing 372 of FIG. 37. FIG. 40 shows the pertinent processing in detail.

First, the operation specification of the function circuit module stk is extracted. Processing 401 is then executed to extract relationships between control signals of stk and operation thereof, which are then described by use of control predicate. This operation simply includes a conversion into a relationship description of relationships between control signals and operations with consideration of the timing items. FIG. 41 shows the conversion result of the operation description of stk.

Thereafter, the internal control signal extract processing of the processing 402 is initiated. In this processing, when the second argument of the control 1 predicate of FIG. 41 is identical to the first argument of the control predicate of FIG. 39, the second argument of the control 1 predicate is replaced with the second argument of the control predicate. In the first line of this description, when 0 is inputted to a control terminal control-in of stc at the timing 1, the system executes noop (namely, no-operation). (In other words, the system does not execute any operation.). Moreover, according to this description, at the timing 1, when 1 is inputted to the control terminal control-in of stc, the system executes

[[ramx(cntrx,=,in],next,
[cntrx,=,[(cntrx,+,1]]] FIG. 42 shows the conversion results attained through the processing above.

Next, the processing 403 is initiated to extract internal control terminals and external control terminals. The external control terminals are specified in the first argument list of the control 1 predicate in FIG. 42. The processing 403 first extracts all external control terminals. In the example of FIG. 42, the 2-bit terminal control-in of the function circuit module stk is extracted as the external.

Next, processing 404 is initiated to synthesize a truth value table with timing information. This processing extracts, based on information described by the control 1 predicate of FIG. 42, relationships to be satisfied between the signals of the internal and external terminals extracted in the processing 403. For example, based on information in the first row of FIG. 42, there can be extracted that when [0, 0] is inputted to the 2-bit external control terminal at a timing 1, [0] is outputted to the [ramx, control-in] terminal at a timing 1 and [0,0] is outputted to the [cntrx, control-in] terminal at a timing 2. Similarly, from information in the second row of FIG. 42, there can be attained that when [0,1] is inputted to the 2-bit external control terminal at a timing 1, [1] is to be outputted to the [ramx, control-in] terminal at a timing 1 and [0,1] is to be outputted to the [cntrx, control-in] terminal at a timing 1.

Figures 43, 44:
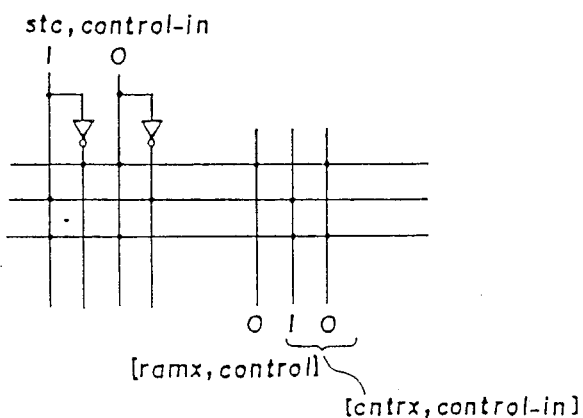
FIG. 43 is a diagram schematically showing generated truth value information including timing information.
FIG. 44 is a diagram showing the configuration of a generated logic circuit.

Subsequently, in the similar fashion, by executing the processing, there is generated a truth value table with timing information as shown in FIG. 43.

In this list, input signals are specified by the two items on the left-hand side and output signals are denoted by the three items ([ramx,control-in] 0 and [cntrx, control-in] 0.1 on the right-hand side. The first line indicates that when bit 1 of the stc control signal is 0 at the timing 1 and bit 0 of the stc control signal is 0 at the timing 1; the ramx control signal is 0 at the timing 1, bit 1 of the cntrx control signal is 0 at the timing 2, and bit 0 thereof is 0 at the timing 0. Subsequent lines also specify relationships between the values of input output signals and timings thereof.

Figure 45:
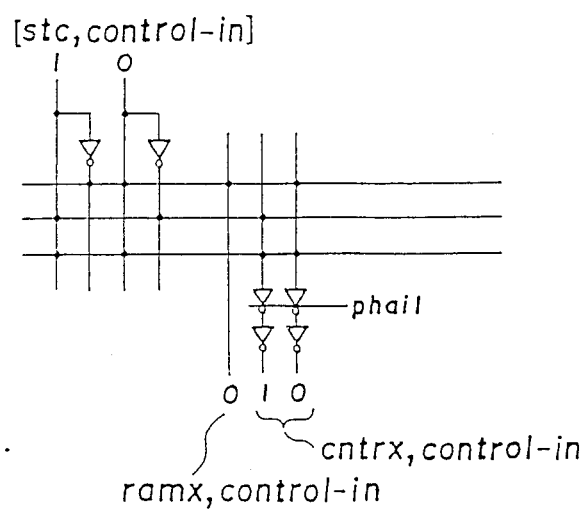
FIG. 45 is a diagram showing the configuration of a generated control logic circuit.

Finally, based on the truth value table with timing information of FIG. 43, a logic circuit implementing the truth value information is synthesized according to the logic synthesis algorithm, which is accomplished in an automatic synthesize section of the logic circuit of FIG. 21. In the example of FIG. 39, the signals to be inputted in or outputted from the same terminal operate at the same timing, and hence the logic circuit can be simply realized by means of an ordinary PLA as shown in FIG. 44. FIG. 44 shows a logic circuit which receives as an input thereto the stc control signal and which produces ramx and cntrx control signals as outputs therefrom. In this diagram, like in the case of FIG. 7, horizontal lines designate outputs obtained by achieving AND operations on input signals. However, the timing relationships cannot be satisfied by the circuit of FIG. 44. This is because the operation timing of cntrx is delayed by one stage as compared with other elements. Consequently, as shown in FIG. 45, the timing relationships can be implemented by inserting clocked inverters operating in synchronism with phai1 for the output terminals to This circuit diagram includes, in addition to the circuit of FIG. 44, a latch circuit to adjust the operation timing, namely, the latch is implemented by use of a tri-state inverter.

Figure 46:
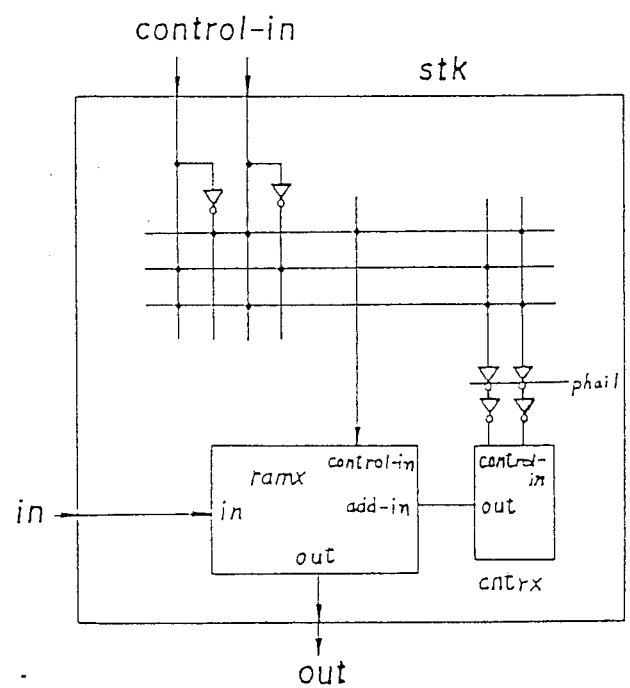
FIG. 46 is a schematic diagram showing the constitution of a generated stack, stk.

FIG. 46 shows a detailed logic circuit of the function circuit module obtained according to the embodiment described above.

FIG. 46 is a circuit diagram showing the overall constitution of the stack stk, which comprises two constituent elements ramx and cntrx. The circuit of FIG. 45 is employed to connect the stk control terminal with the ramx and cntrx control terminals.

Moreover, the input to the stk and the output from ramx are respectively connected to the input to ramx and the output of stk.

According to the embodiments above, as the number of accumulated function circuit modules available for the circuit design, the period of time necessary for the module design increases namely, the number of design steps can be greatly reduced; furthermore, the increase in the number of circuits included in the function circuit module thus designed can be limited to several percent also when compared with a case where the design is effected by the human power (namely, in a case where the complete design is effected).

According to the present invention as described above, by only specifying appropriate parameters, operation specifications, and structure specifications through a reuse of known function circuit modules registered to a storage, a logic circuit of a complicated function circuit module can be automatically synthesized with a high quality (with a reduced number of elements); consequently, there is attained an effect that the period of time required to design the function circuit module can be considerably minimized.

Moreover, in a case where a logic circuit designer has designed a complex function circuit module according to a new configuration method, the new function circuit module model can be easily registered to the function module model store section by describing, with prolog variables and basic built-in functions, the configuration elements (parts circuits) constituting the function circuit module to be designed and operation information to be satisfied by the function circuit module, which consequently enables also the logic designer to easily expand the system.

While the present invention has been described with reference to the particular illustrative embodiments, it is not to be restricted by those embodiments but only by the appended claims. It is to be appreciated that those skilled in the art can change and modify the embodiments without departing from the scope and spirit of the present invention.

What we claim is:

1. An automatic design system of a logic circuit for generating control signals of a circuit system including a plurality of function circuit modules comprising:

first store means for storing control information formats for the circuit system by use of bit patterns;

second store means for storing information about a constitution of each said function circuit module constituting the circuit system;

third store means for storing information related to a function of each said function circuit module constituting the circuit system in a form of second operation information corresponding to a bit pattern of a control signal of the circuit system;

means for analyzing, based on the control instruction formats of said first store means and information of said second store means, an operation of each said function circuit module so as to represent the operation of said each function circuit module by use of a first operation information;

means for extracting, by referencing said first operation information and said second operation information, bit patterns for which matching is found with respect to operation contents so as to generate truth value information of said logic circuit according to the extracted bit patterns; and means for generating control signals of said circuit system from said truth value information.

2. A automatic design system for describing a circuit module having a desired function and constituting a logic circuit by use of a combination of operation specifications of known circuit modules, comprising:

first store means for storing an operation specification and a structure specification of a function circuit module defined by combining known basic function circuit modules constituting the logic circuit and of said basic circuit modules;

second store means for storing an operation specification of a circuit module having a desired function, said specification described in a combination of operation specifications of known basic function circuit modules;

means for analyzing operation specifications of said circuit modules stored in said second store means by use of the operation specification and the structure specifications stored in said first store means so as to extract a group of operation specifications of said known basic function circuit modules satisfying the operation specifications of the circuit modules having the desired functions; and third store means for storing the group of the operation specifications extracted by said means for analyzing.

3. An automatic design system according to claim 2 further including:

means for extracting network information between said known basic function circuit modules from the group of the operation specifications stored in said third store means; and fourth store means for storing the network information.

4. An automatic design system of a logic circuit system including a plurality of parts circuits comprising:

a means for inputting operation description information representing relationships between input signals of a logic circuit to be designed, internal states thereof, and output signals thereof;

means for storing operation description information related to structures and functions of the parts circuits of the logic circuit system;

means for unifying a portion of said operation description information of the logic circuit and said operation description information of said parts circuits so as to determine logic relationships satisfying the operation description information of said parts circuits between input/output signals of at least one of said parts circuits, said input/output signals include input/output signals of the logic circuit system and said logic relationships include timing information;

means for synthesizing, based on said logic relationships, circuits connecting said parts circuits; and means for outputting information of the logic circuit system synthesized with said parts circuits including said circuits connecting said parts circuits.

5. An automatic design system according to claim 4 wherein said synthesizing means includes means for storing information about relationships between design parameters specifying a structure of the logic circuit system and design parameters of said parts circuits such that when the design parameters of said logic circuit system are inputted, values of the design parameters are propagated, based on said relationship information thus stored, to the design parameters of said parts circuits, thereby automatically generating the design parameters of said parts circuits.

6. An automatic design system according to claim 5 wherein said means for synthesizing includes means for propagating the values of the design parameters, said means for propagating including a first function adding n to a design parameter m, a second function subtracting n from the design parameter m, a third function supplying a clock signal generated at a timing subsequent to a timing associated with a clock signal m, and a fourth function supplying a value of a bit length of an address signal necessary for an information storage with a memory capacity m.

7. An automatic design system according to claim 4 wherein said means for synthesizing includes means for storing information about relationships between design parameters specifying a structure and operations of the logic circuit system and design parameters of said parts circuits such that when the design parameters of said logic circuit system are inputted, values of the design parameters are propagated, based on said relationship information thus stored, to the design parameters of said parts circuits, thereby automatically generating the design parameters of said parts circuits.

8. An automatic design system according to claim 6 wherein said means for synthesizing includes means for propagating the values of the design parameters, said means for propagating including a first function adding n to a design parameter m, a second function subtracting n from the design parameter m, a third function supplying a clock signal generated at a timing subsequent to a timing associated with a clock signal m, and a fourth function supplying a value of a bit length of an address signal necessary for an information storage with a memory capacity m.

* * * * *

UNITED STATES PATENT AND TRADEMARK OFFICE
CERTIFICATE OF CORRECTION

PATENT NO. : 4,964,056

DATED : 16 October 1990

INVENTOR(S) : BEKKI et al.                Page 1 of 3

It is certified that error appears in the above-identified patent and that said Letters Patent is hereby corrected as shown below:

| Column | Line | |
|---|---|---|
| 1 | 63 | After "stored" delete "beforehand" and insert --beforehand-- after "storage". |
| 3 | 35 | After "ring" insert --counter;--. |
| 4 | 28 | Change "part" to --parts--. |
| 5 | 2 | Change "cathoderay" to --cathode-ray--. |
| 5 | 8 | After "job" change "store" to --storage--. |
| 5 | 14 | Change "its" to --bits--. |
| 5 | 20 | Change "16" to --16--. |
| 5 | 52 | After "the" insert --instruction achieves the following operations depending on the-- |
| 5 | 55 | change "R2" to --R1--. |
| 5 | 56 | Change "R3" to --R2--. |
| 5 | 56-57 | Insert --011: B1 <- R3--. |
| 5 | 58 | Change "B1" to --B1--. |
| 5 | 61 | Change "N" to --No--. |
| 7 | 17 | Delete "indicates a field". |
| 7 | 47 | Change "in5" to --in5--. |
| 8 | 21 | After "operations" began a new paragraph. |
| 8 | 58 | Change "beforehand stored" to --stored beforehand--. |

UNITED STATES PATENT AND TRADEMARK OFFICE
CERTIFICATE OF CORRECTION

PATENT NO. : 4,964,056

DATED : 16 October 1990

INVENTOR(S) : BEKKI et al.

It is certified that error appears in the above-identified patent and that said Letters Patent is hereby corrected as shown below:

| Column | Line | |
|---|---|---|
| 9 | 16 | Change "dipsosed" to --disposed--. |
| 9 | 18 | Change "description" to --descriptions--. |
| 10 | 24 | Change "conters" to --counters--. |
| 12 | 25 | After "First" insert --,--. |
| 12 | 42 | Change "if" to --in--. |
| 13 | 23 | After "and" delete "an". |
| 13 | 51 | Change "beforehand stored" to --stored beforehand--. |
| 13 | 53 | After "are" delete "beforehand". |
| 13 | 54 | Before "in many" insert --beforehand--. |
| 15 | 41 | Delete "and". |
| 16 | 11-12 | Change "variables" to --variable--. |
| 16 | 34 | Change "basoc" to --basic--. |
| 18 | 28 | Change "phail" to --phai 1--. |
| 18 | 39 | Change "phail" to --phai 1--. |
| 18 | 61 | Change "phai 11" to --phai 1--. |
| 18 | 65 | Change "(phail)" to --(phai 1)--. |
| 18 | 68 | Change "phail" to --phai 1--. |
| 19 | 61 | Change "matxh (x,x(" to --match (x,x)--. |

UNITED STATES PATENT AND TRADEMARK OFFICE
CERTIFICATE OF CORRECTION

PATENT NO. : 4,964,056

DATED : 16 October 1990

INVENTOR(S) : BEKKI et al.   Page 3 of 3

It is certified that error appears in the above-identified patent and that said Letters Patent is hereby corrected as shown below:

| Column | Line | |
|---|---|---|
| 19 | 68 | Change "element slots" to --elements slots--. |
| 20 | 4 | Change "element slots" to --elements slots--. |
| 21 | 34 | Change "[]" to --[]--. |
| 21 | 55 | Change "S = []" to --S = []--. |
| 21 | 63 | Change "S = []" to --S = []--. |
| 25 | 21 | Change "phail" to --phai 1--. |
| 25 | 22 | After "to" insert --[cntrx, control-in]--. |
| 26 | 36 | Change "A" to --An--. |

Signed and Sealed this

Seventh Day of July, 1992

Attest:

DOUGLAS B. COMER

Attesting Officer   Acting Commissioner of Patents and Trademarks